(12) United States Patent
Hara et al.

(10) Patent No.: US 9,035,722 B2
(45) Date of Patent: May 19, 2015

(54) LADDER FILTER, DUPLEXER AND MODULE

(75) Inventors: Motoaki Hara, Miyagi (JP); Shogo Inoue, Tokyo (JP); Jun Tsutsumi, Tokyo (JP); Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 504 days.

(21) Appl. No.: 13/454,940

(22) Filed: Apr. 24, 2012

(65) Prior Publication Data

US 2012/0274416 A1 Nov. 1, 2012

(30) Foreign Application Priority Data

Apr. 27, 2011 (JP) ................. 2011-100193

(51) Int. Cl.
*H03H 9/64* (2006.01)
*H03H 9/54* (2006.01)
*H03H 9/72* (2006.01)
*H03H 9/00* (2006.01)
*H03H 9/05* (2006.01)

(52) U.S. Cl.
CPC ............. *H03H 9/542* (2013.01); *H03H 9/0023* (2013.01); *H03H 9/0566* (2013.01); *H03H 9/725* (2013.01)

(58) Field of Classification Search
CPC ......... H03H 9/64; H03H 9/6483; H03H 9/72; H03H 9/725
USPC .......................................... 333/133, 193–196
See application file for complete search history.

(56) References Cited

U.S. PATENT DOCUMENTS

| | | | |
|---|---|---|---|
| 5,202,652 A * | 4/1993 | Tabuchi et al. ................. | 333/193 |
| 5,999,069 A | 12/1999 | Ushiroku | |
| 2005/0025324 A1 | 2/2005 | Takata | |
| 2007/0159274 A1 | 7/2007 | Onzuka | |
| 2009/0256649 A1* | 10/2009 | Taniguchi ..................... | 333/186 |

FOREIGN PATENT DOCUMENTS

| | | |
|---|---|---|
| JP | 6-350390 A | 12/1994 |
| JP | 09-116379 A | 5/1997 |
| JP | 11-55067 A | 2/1999 |
| JP | 2005-045475 A | 2/2005 |
| JP | 2007-202136 A | 8/2007 |

OTHER PUBLICATIONS

Japanese Office Action dated Dec. 16, 2014 in a counterpart Japanese patent application No. 2011-100193.

* cited by examiner

*Primary Examiner* — Dean Takaoka
(74) *Attorney, Agent, or Firm* — Chen Yoshimura LLP

(57) ABSTRACT

A ladder filter includes at least one series resonator connected in series between an input terminal and an output terminal, at least one parallel resonator connected in parallel with the at least one series resonator, an additional resonator connected in series between the at least one series resonator and one of the input terminal and the output terminal, and an inductor connected in series to the additional resonator, the additional resonator having a resonance frequency higher than an anti-resonance frequency of the at least one series resonator.

11 Claims, 15 Drawing Sheets

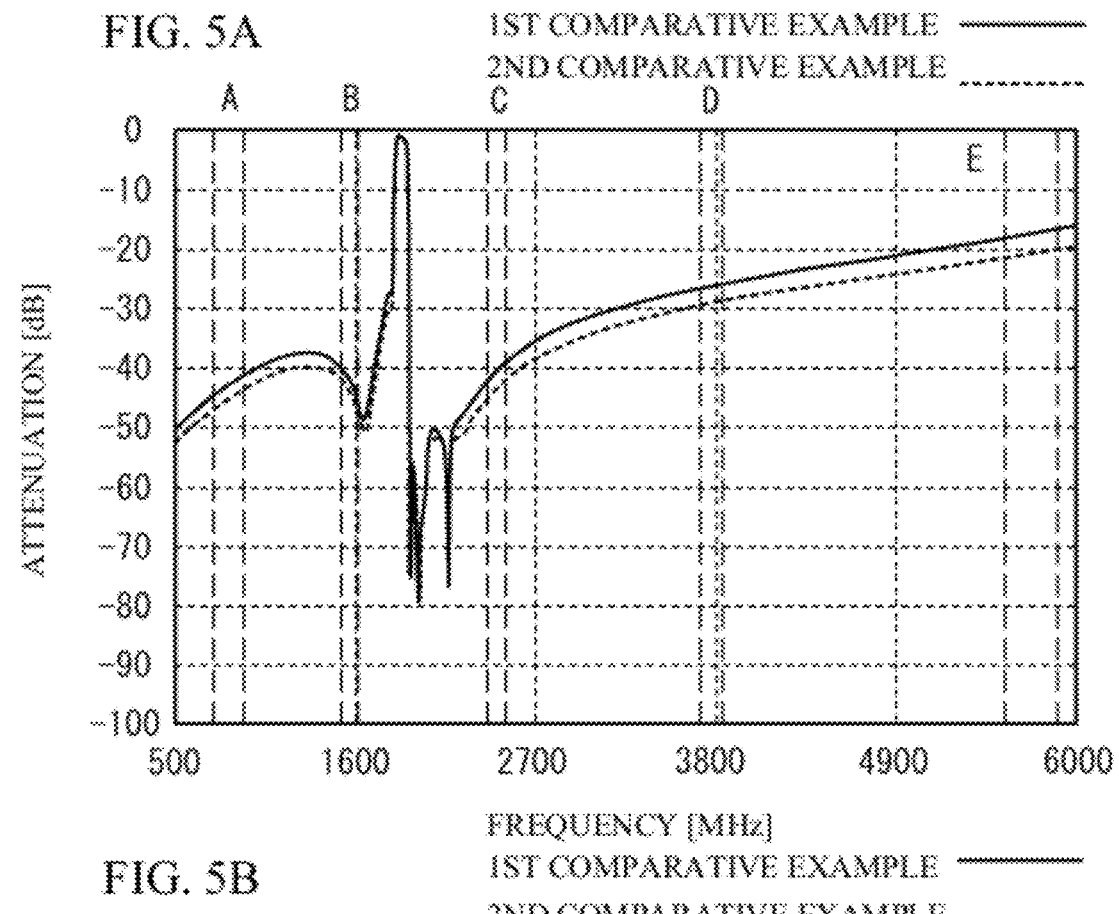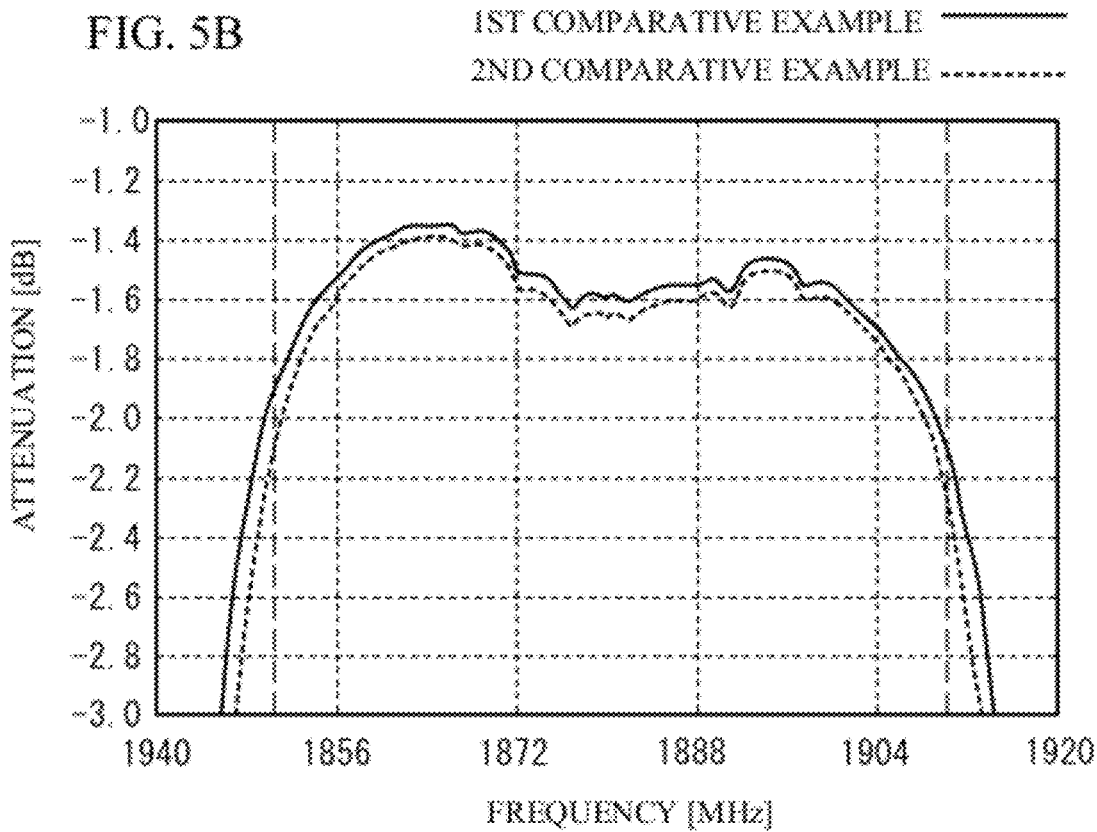

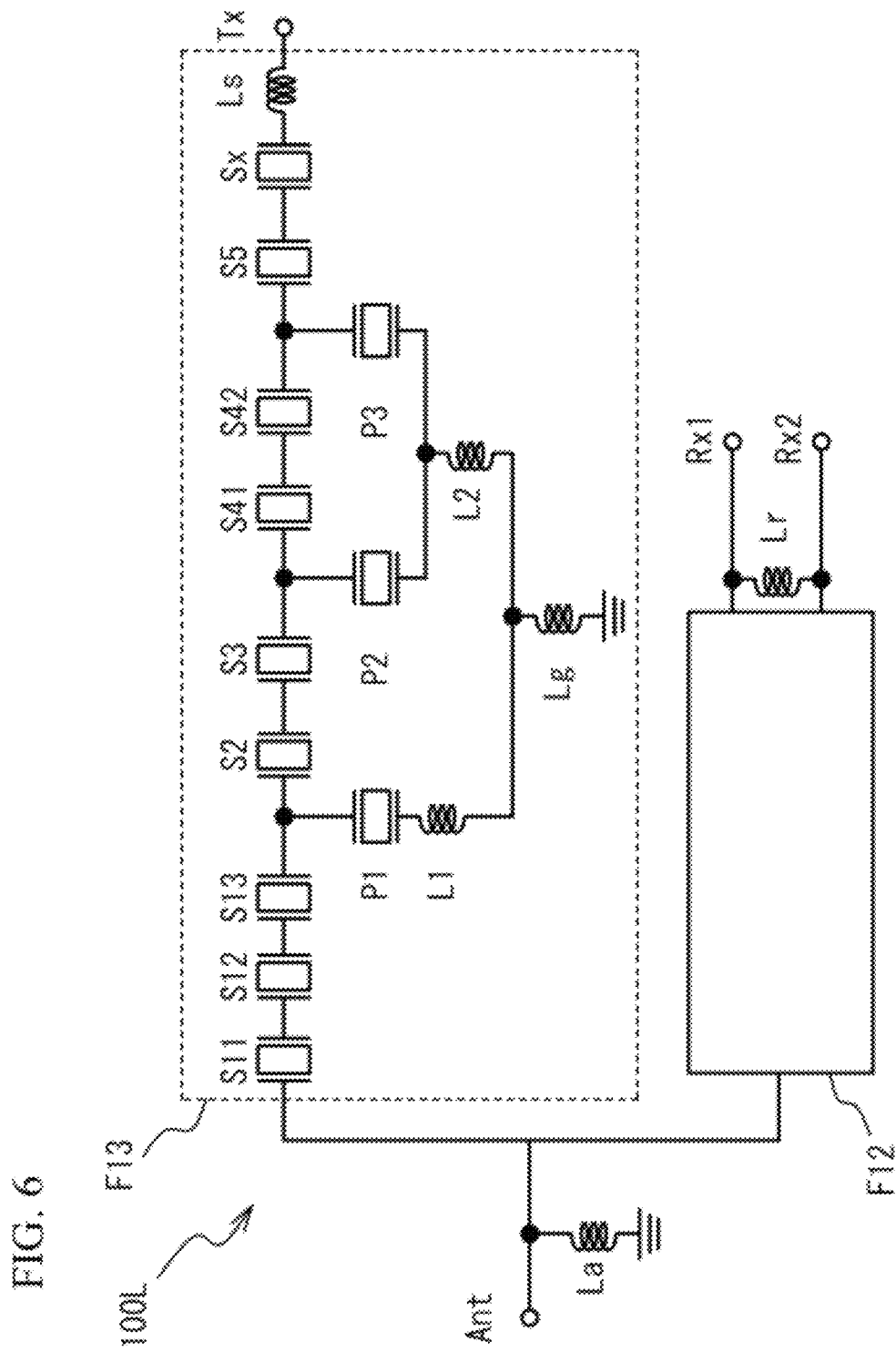

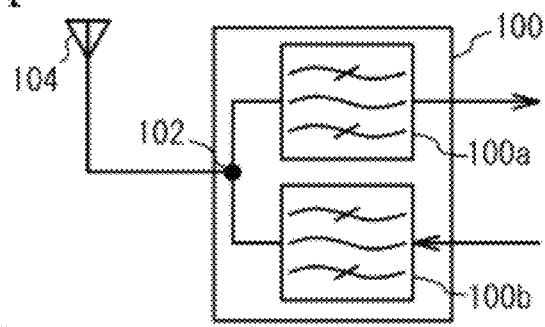
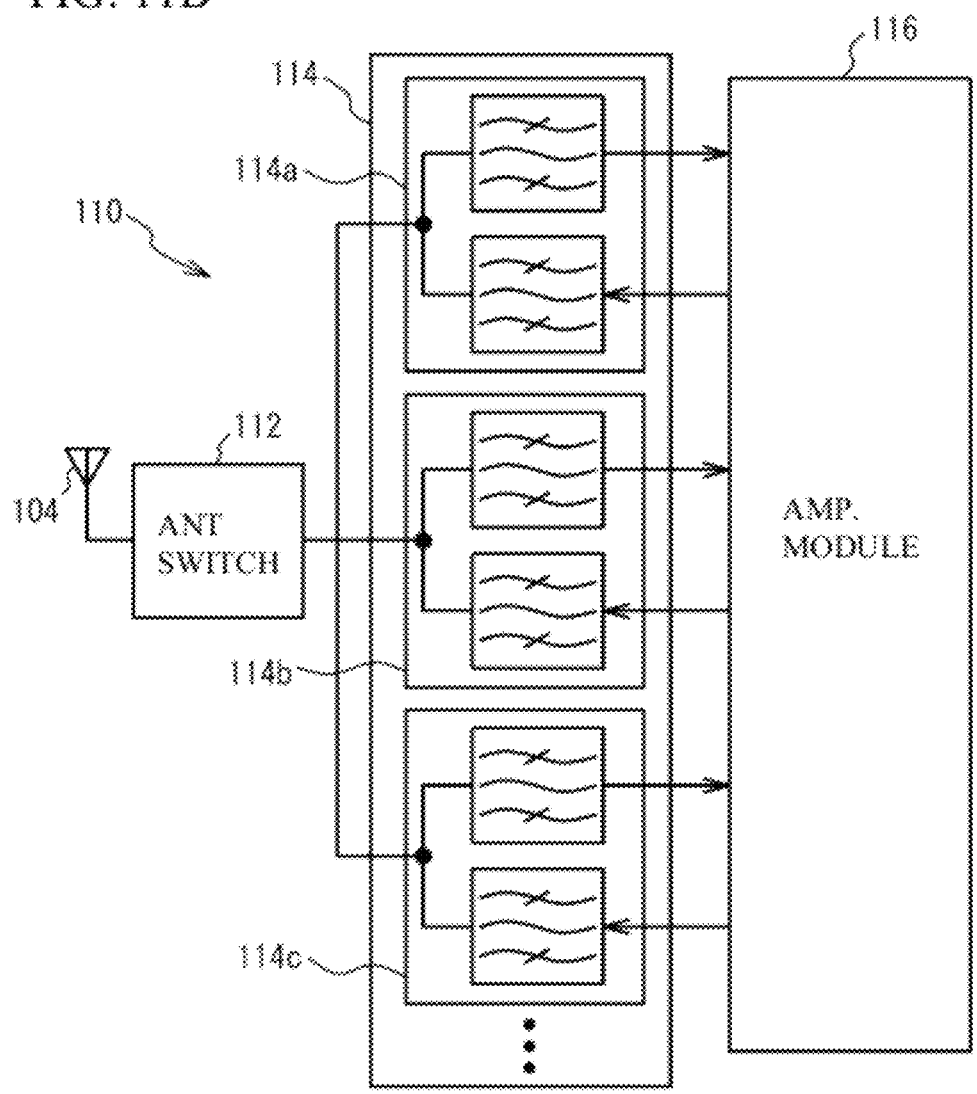

US 9,035,722 B2

LADDER FILTER, DUPLEXER AND MODULE

CROSS-REFERENCE TO RELATED APPLICATION

This application is based upon and claims the benefit of priority of the prior Japanese Patent Application No. 2011-100193, filed on Apr. 27, 2011, the entire contents of which are incorporated herein by reference.

FIELD

A certain aspect of the present invention relates to ladder filters, duplexers and modules.

BACKGROUND

Recently, portable telephones and portable information terminals have rapidly spread due to the development of mobile communication systems. Thus, there is an increasing demand for RF filters, particularly, those having a compact size and a sharp characteristic. The filters are required to generate an attenuation pole and have sufficient suppression over a broad band in order to handle a new communication system. Such filters may be a ladder filter in which multiple resonators are connected. A duplexer or module equipped with filters is required to have transmission and reception filters configured so that the transmission filter has high suppression in the pass band of the reception filter and the reception filter has high suppression in the pass band of the transmission filter. There is a proposal of a filter equipped with an inductor in order to adjust the filter characteristics.

Japanese Patent Application Publication No. 6-350390 (Document 1) discloses a resonator with which an LC resonance circuit is connected in parallel. Japanese Patent Application Publication No. 11-55067 (Document 2) discloses a ladder filter to which an inductor is connected. The arts disclosed in Documents 1 and 2 are capable of generating an attenuation pole outside of the pass band.

SUMMARY

According to an aspect of the present invention, there are provided a ladder filter, a duplexer and a module having high suppression over a broad band.

According to another aspect of the present invention, there is provided a ladder filter including: at least one series resonator connected in series between an input terminal and an output terminal; at least one parallel resonator connected in parallel with the at least one series resonator; an additional resonator connected in series between the at least one series resonator and one of the input terminal and the output terminal; and an inductor connected to the additional resonator in series, the additional resonator having a resonance frequency higher than an anti-resonance frequency of the at least one series resonator.

BRIEF DESCRIPTION OF THE DRAWINGS

FIG. 5A is a diagram of an attenuation characteristic of the ladder filter in accordance with the comparative example, and FIG. 5B is an enlarged view of a pass band illustrated in FIG. 5A;

FIG. 6 is a circuit diagram of a duplexer using a ladder filter having an inductor in a series arm;

FIG. 11A is a block diagram of an exemplary duplexer, and FIG. 11B is a block diagram of an exemplary RF (Radio Frequency) module in accordance with a first embodiment;

DETAILED DESCRIPTION

Figure 1A:
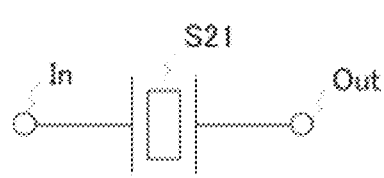
FIG. 1A is a circuit diagram of a series resonator.
Figure 1B:
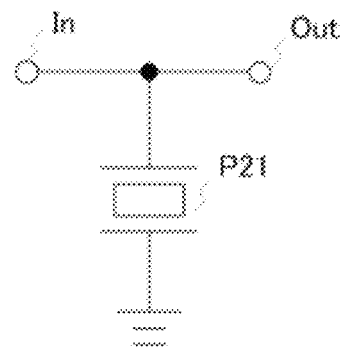
FIG. 1B is a circuit diagram of a parallel resonator.

A ladder filter is now described. FIG. 1A is a circuit diagram of a series resonator, FIG. 1B is a circuit diagram of a parallel resonator, and FIG. 1C is a diagram of a pass characteristic of the series resonator and that of the parallel resonator.

As illustrated in FIG. 1A, the series resonator has a resonator S21 having a pair of ports (signal terminals), one of which is an input terminal In and the other is an output terminal Out. As illustrated in FIG. 1B, the parallel resonator has a resonator P21 having a pair of ports, one of which is connected to a ground terminal and the other is connected to a short-circuit line between the input terminal In and the output terminal Out.

Figure 1C:
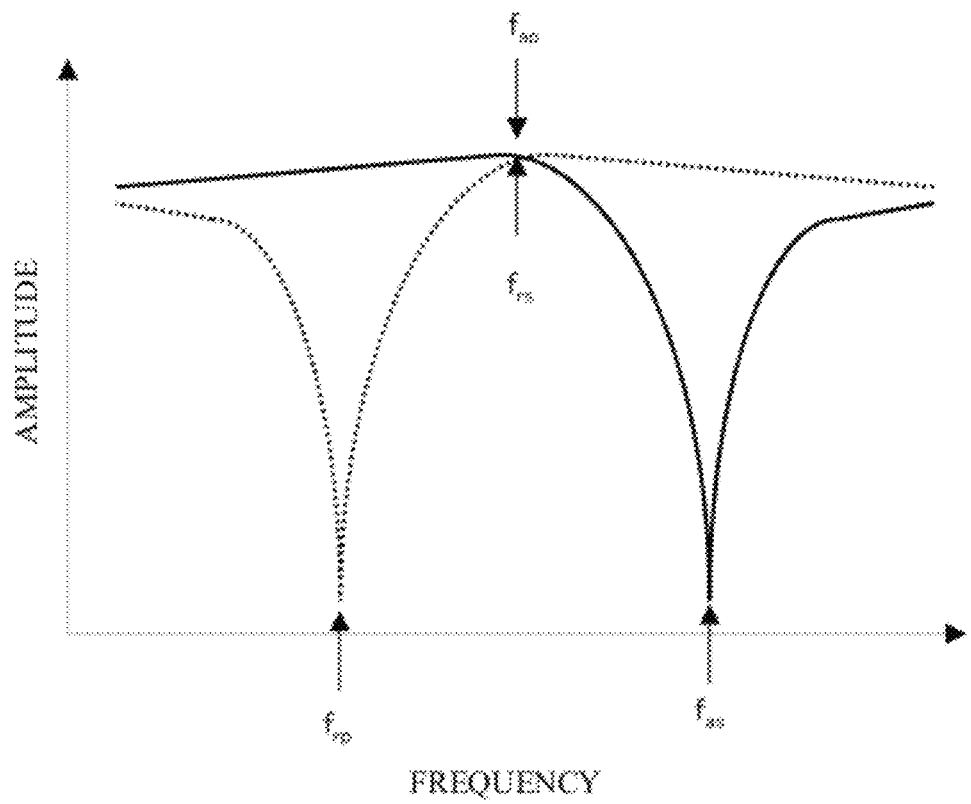
FIG. 1C is a diagram of a pass characteristic of the series resonator and that of the parallel resonator.

The horizontal axis of FIG. 1C denotes the frequency, and the vertical axis thereof denotes the amplitude or magnitude. The pass characteristic of the series resonator is indicated by a solid line, and that of the parallel resonator is indicated by a broken line. As illustrated in FIG. 1C, the pass characteristic of the series resonator has one resonance point (resonance frequency) $f_{rs}$ and one anti-resonance point (anti-resonance frequency) $f_{as}$. The amplitude is the largest at the resonance point $f_{rs}$, and is the smallest at the anti-resonance point $f_{as}$. The pass characteristic of the parallel resonator has one resonance point $f_{rp}$ and one anti-resonance point $f_{ap}$. The amplitude is the smallest at the resonance point $f_{rp}$ and is the largest at the anti-resonance point $f_{ap}$.

Figure 2A:
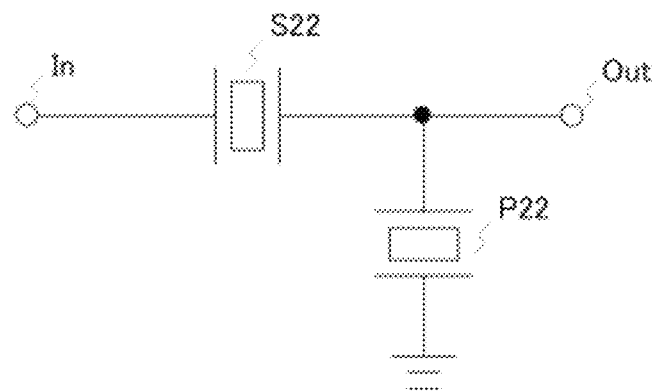
FIG. 2A is a circuit diagram of a single-stage ladder filter.
Figure 2B:
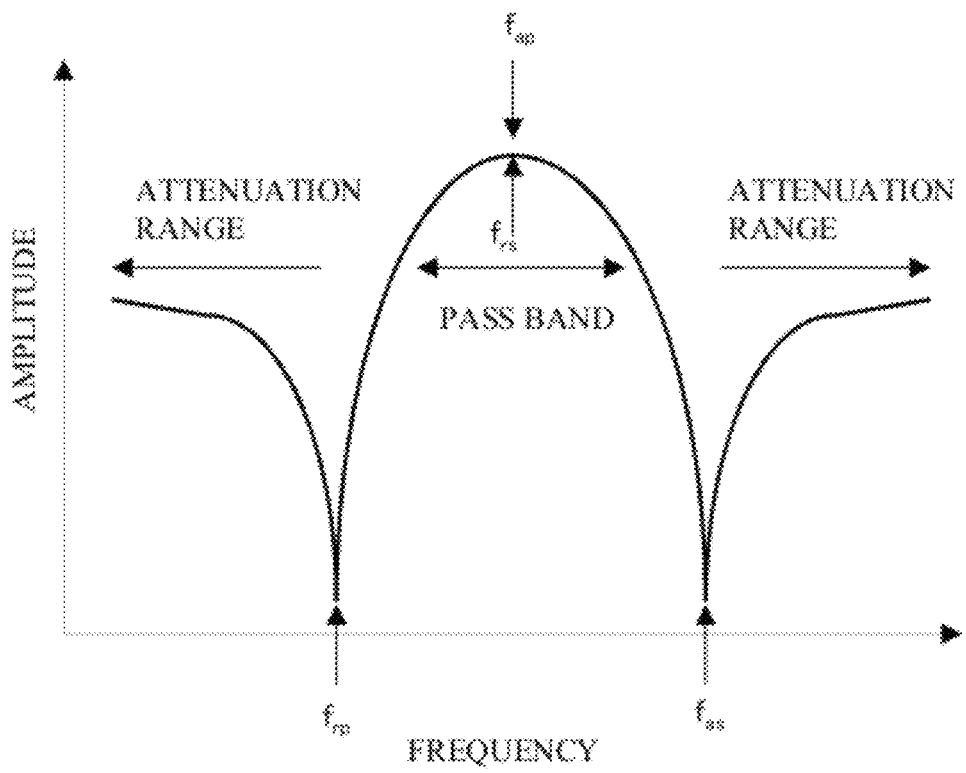
FIG. 2B is a diagram of a pass characteristic of the single-stage ladder filter.

FIG. 2A is a circuit diagram of a single-stage ladder filter, and FIG. 2B illustrates a pass characteristic of the ladder filter illustrated in FIG. 2A.

As illustrated in FIG. 2A, a series resonator S22 is connected in series to the input terminal In and the output terminal Out, and a parallel resonator P22 is connected between the output terminal Out and ground. The resonance point $f_{rs}$ of the series resonator S22 and the anti-resonance point $f_{ap}$ of the parallel resonator P22 are designed to be approximately equal to each other.

The horizontal axis of FIG. 2B is the frequency, and the vertical axis thereof is the amplitude. The ladder filter in FIG. 2A has a pass characteristic as illustrated in FIG. 2B, which is a combination of the pass characteristic of the series resonator and that of the parallel resonator. The amplitude is the largest around the resonance point $f_{rs}$ of the series resonator S22 and the anti-resonance point $f_{ap}$ of the parallel resonator P22, and is the smallest around the anti-resonance point $f_{as}$ of the series resonator S22 and the resonance point $f_{rp}$ of the parallel resonator P22. The ladder filter in FIG. 2A has a pass band between the resonance frequency $f_{rp}$ of the parallel resonator P22 and the anti-resonance point $f_{as}$ of the series resonator S22, and has an attenuation range equal to or lower than the resonance frequency $f_{rp}$ of the parallel resonator P22 and that equal to or higher than the anti-resonance point $f_{as}$ of the series resonator S22. Thus, the ladder filter functions as a bandpass filter. The frequency $f_{up}$ at the high-frequency end of the pass band is the frequency $f_{as}$ of the anti-resonance point (anti-resonance frequency) of the series resonator S22. The frequency $f_{down}$ of the low-frequency end of the pass band is the frequency of the resonance point (resonance frequency) $f_{rp}$ of the parallel resonator P22.

Figure 3A:
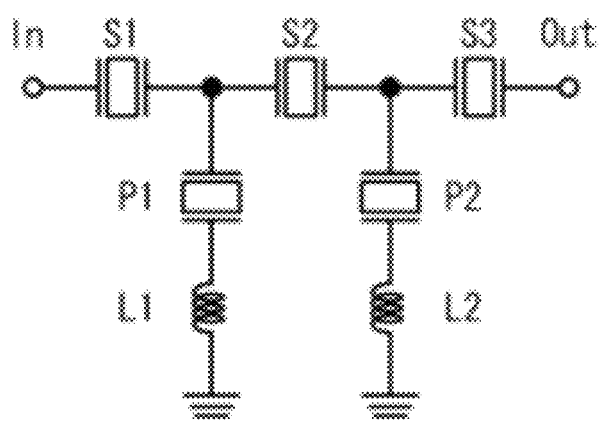
FIG. 3A is a circuit diagram of a ladder filter having attenuation poles at the high-frequency side of the ladder filter.
Figure 3B:
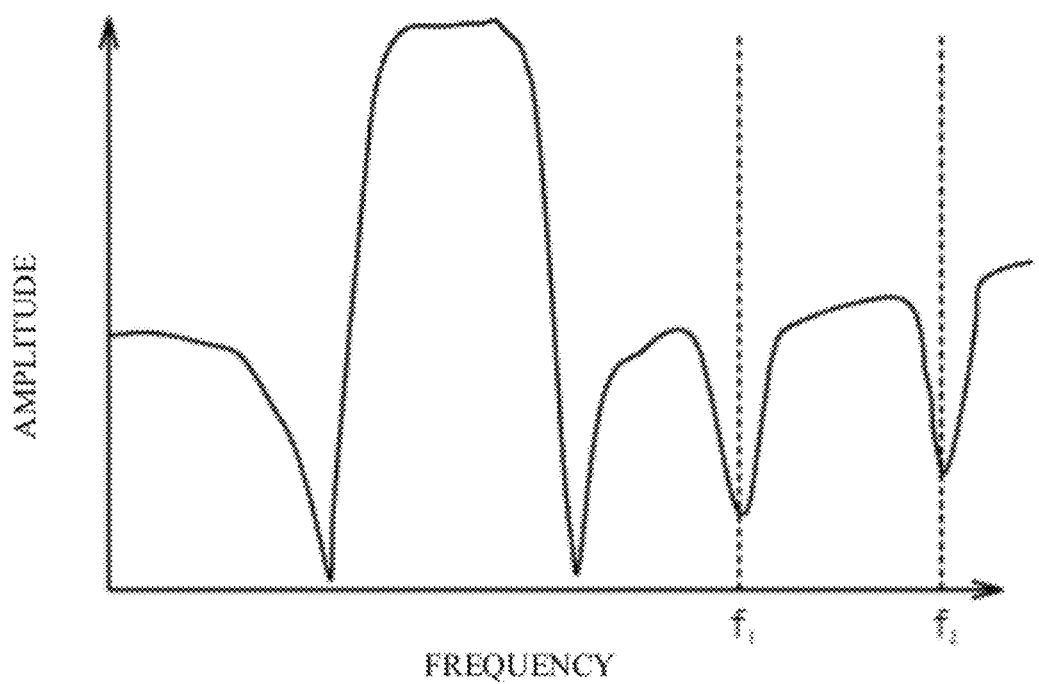
FIG. 3B is a diagram of an attenuation characteristic of the ladder filter.

A ladder filter having an attenuation pole at a harmonic is now described, and a description of a multi-stage ladder filter is followed. FIG. 3A is a circuit diagram of a multi-stage ladder filter, and FIG. 3B is a diagram of an attenuation characteristic of the multi-stage ladder filter. The horizontal axis of FIG. 3B is the frequency, and the vertical axis thereof is the amplitude.

As illustrated in FIG. 3A, a ladder filter F11 is composed of series resonators S1, S2 and S3, parallel resonators P1 and P2, and inductors L1 and L2. The series resonators S1, S2 and S3 are connected in series to each other between the input terminal In and the output terminal Out. The series resonator S1 is connected to the input terminal In, and the series resonator S3 is connected to the output terminal Out.

One end of the parallel resonator P1 is connected to a node between the series resonators S1 and S2. One end of the parallel resonator P2 is connected to a node between the series resonators S2 and S3. The other end of the parallel resonator P1 and one end of the inductor L1 are connected in series to each other, and the other end of the inductor L1 is grounded. The other end of the parallel resonator P2 and one end of the inductor L2 are connected in series to each other, and the other end of the inductor L2 is grounded. The resonators function as capacitors outside of the pass band. Thus, the parallel resonator P1 and the inductor L1 function as an LC resonance circuit, and the parallel resonator P2 and the inductor L2 function as an LC resonance circuit. It is assumed that the capacitance of each of the parallel resonators P1 and P2 is denoted as $C_p$, and the inductance of the inductor L1 is denoted as $L_1$. In this case, the resonance frequency $f_1$ of the LC resonance circuit formed by the parallel resonator P1 and the inductor L1 is expressed as follows:

$$f_1 = \frac{1}{2\pi\sqrt{L_1 C_P}}$$

The resonance frequency $f_2$ of the LC resonance circuit formed by the parallel resonator P2 and the inductor L2 is described in a similar way to the above expression.

As illustrated in FIG. 3B, attenuation poles are formed at the frequencies $f_1$ and $f_2$. By adjusting the capacitance value of the parallel resonator and the inductance value of the inductor, the frequencies at which the attenuation poles appear can be adjusted. For example, the frequencies $f_1$ and $f_2$ may be selected so as to be respectively included in a frequency band corresponding to the second harmonic of the pass band of the filter and a frequency band corresponding to the third harmonic thereof. It is thus possible to form the attenuation poles in the second and third harmonics.

Although the ladder filter F11 has two parallel arms, more attenuation poles may be formed by employing more parallel arms and associated inductors. However, an increased number of parallel arms may increase the signal loss in the pass band, and may prevent downsizing of the filter. Further, in a case where an attenuation pole is formed in a low-frequency range, the inductors L1 and L2 may be varied to have larger inductance values. For example, in a case where an attenuation pole is formed at the low-frequency side of the pass band (left-hand side in FIG. 3B), inductance values as large as 1~5 nH may be used. The use of inductors having large inductance values may prevent downsizing of the ladder filter. At the high-frequency side of the pass band, the inductor L1 or L2 may function as a choke coil, and sufficient suppression may not be obtained at frequencies higher than those of the pass band. As described above, it is difficult to realize high suppression over the broad band.

A comparative example is now described. A duplexer 100R in accordance with the comparative example corresponds to, for example, the W-CDMA (Wideband Code Division Multiple Access) Band 2 system. The pass band of a transmission filter F11 overlaps the transmission band of the W-CDMA Band 2 system that ranges from 1850 MHz to 1910 MHz. The pass band of a reception filter F12 overlaps the reception band of the W-CDMA Band 2 system that ranges from 1930 MHz to 1990 MHz. For example, a system in which the transmission band and the reception band are close to each other, such as the W-CDMA Band 2 system, may be designed to generate an attenuation pole around the high-frequency end of the pass band of the transmission filter to improve the sharpness, whereby high suppression is ensured in the pass band of the reception filter. It is thus possible to suppress the interference between the filters. In order to generate the attenuation pole, an inductor may be connected to the parallel arm, as illustrated in FIG. 3A.

Figure 4:
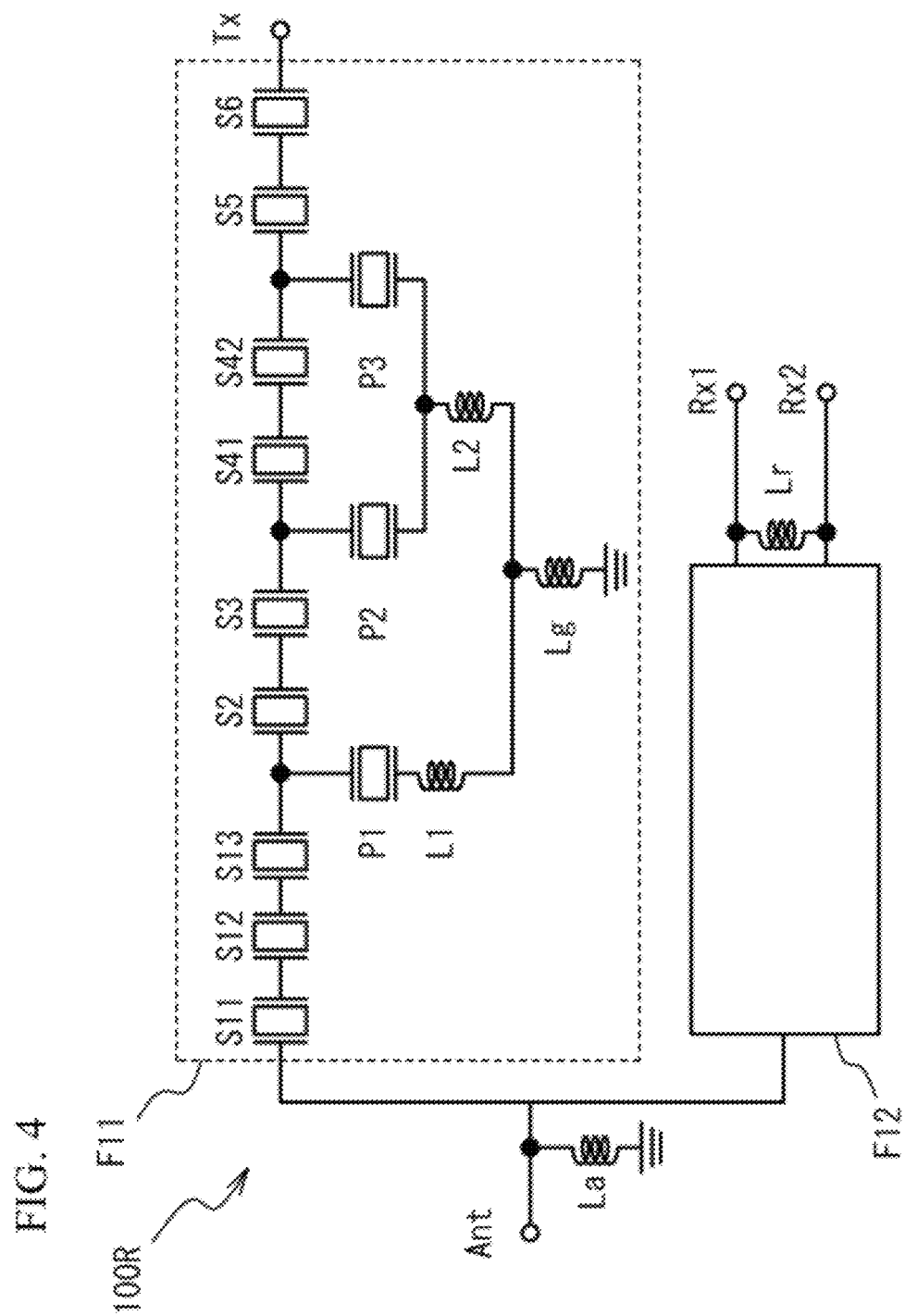
FIG. 4 is a circuit diagram of a ladder filter in accordance with a comparative example.

FIG. 4 is a circuit diagram of a duplexer with the ladder filter of the comparative example. FIG. 5A illustrates an attenuation characteristic of the ladder filter of the comparative example, and FIG. 5B illustrates an enlarged view of a pass band illustrated in FIG. 5A.

Referring to FIG. 4, the duplexer 100R of the comparative example includes the transmission filter F11, the reception filter F12, an antenna terminal Ant, a transmission terminal Tx, reception terminals Rx1 and Rx2, and inductors La and Lr. The inductor La, the transmission filter F11 and the reception filter F12 are connected in parallel with the antenna terminal Ant.

One end of the reception filter F12 is connected to the antenna terminal Ant and one end of the transmission filter F11, and the other end thereof is connected to the two reception terminals Rx1 and Rx2. The inductor Lr is connected between the reception terminals Rx1 and Rx2. The inductors La and Lr function as those for impedance matching. The reception filter F12 may be a ladder filter.

The transmission filter F11 is the ladder filter of the comparative example. The transmission filter F11 is composed of series resonators S11~S13, S2, S3, S41~S42, S5 and S6, and parallel resonators P1~P3, and inductors L1, L2 and Lg. The series resonators S11~S6 are connected in series to each other. One end of the series resonator S11 is connected to the antenna terminal Ant and one end of the reception filter F12. One end of the series resonator S6 is connected in series to the transmission terminal Tx.

One end of the parallel resonator P1 is connected in parallel with a node between the series resonator S13 and the series resonator S2, and the other end thereof is connected in series to one end of the inductor L1. One end of the parallel resonator P2 is connected in parallel with a node between the series resonator S3 and the series resonator S41. One end of the parallel resonator P3 is connected in parallel with a node between the series resonator S42 and the series resonator S5. The other end of the parallel resonator P2 and the other end of the parallel resonator P3 are connected in parallel with one end of the inductor L2. The other end of the inductor L1 and the other end of the inductor L2 are connected in parallel with one end of the inductor Lg. The other end of the inductor Lg is grounded. Next, a description is given of the capacitances and resonance frequencies of the resonators included in the ladder filter of the comparative example (transmission filter F11).

Table 1 indicates the capacitance values and resonance frequencies of the resonators of the ladder filter of the first comparative example.

TABLE 1

| Resonator | Capacitance [pF] | Resonance frequency [MHz] |
| --- | --- | --- |
| S11 | 3.879 | 1881 |
| S12 | 3.879 | 1881 |
| S13 | 3.879 | 1881 |
| S2 | 7.8 | 1968 |
| S3 | 1.67 | 1901 |
| S41 | 1.491 | 1889 |
| S42 | 1.491 | 1889 |
| S5 | 6.49 | 1876 |
| S6 | 9.23 | 1881 |
| P1 | 2.317 | 1816 |
| P2 | 1.979 | 1819 |
| P3 | 2.243 | 1820 |

As indicated in Table 1, the capacitance values of the series resonators S11~S13 are 3.879 pF, and the resonance frequencies thereof are 1881 MHz. The capacitance value of the series resonator S2 is 7.8 pF, and the resonance frequency thereof is 1968 MHz. The capacitance of the series resonator S3 is 1.67 pF, and the resonance frequency thereof is 1901 MHz. The capacitance values of the series resonators S41 and S42 are 1.491 pF, and the resonance frequencies thereof are 1889 MHz. The capacitance value of the series resonator S5 is 6.49 pF, and the resonance frequency thereof is 1876 MHz. The capacitance value of the series resonator S6 is 9.23 pF, and the resonance frequency thereof is 1881 MHz. The capacitance value of the parallel resonator P1 is 2.317 pF, and the resonance frequency thereof is 1816 MHz. The capacitance value of the parallel resonator P2 is 1.979 pF, and the resonance frequency thereof is 1819 MHz. The capacitance value of the parallel resonator P3 is 2.243 pF, and the resonance frequency thereof is 1820 MHz. The inductance values of the inductors L1, L2 and Lg are 0.5~2 nH, for example.

As described above, outside of the pass band, the resonator functions as a capacitor. By adjusting the capacitance of the resonator, the attenuation characteristic may be varied over a broader band. For example, the amount of attenuation may be increased in a broader band by increasing the ratio $C_p/C_s$ where $C_s$ is the combined capacitance of the series resonator and $C_p$ is the combined capacitance of the parallel resonator. Such a resonator having increased suppression is referred to as a second comparative example.

Table 2 illustrates exemplary capacitance values and resonance frequencies of the resonators of a ladder filter in accordance with the second comparative example. The circuit configuration of the ladder filter of the second comparative example is the same as illustrated in FIG. 4, and a description thereof is omitted here.

TABLE 2

| Resonator | Capacitance [pF] | Resonance frequency [MHz] |
| --- | --- | --- |
| S11 | 3.618 | 1881 |
| S12 | 3.618 | 1881 |
| S13 | 3.618 | 1881 |
| S2 | 7.43 | 1968 |
| S3 | 1.558 | 1901 |
| S41 | 1.393 | 1889 |
| S42 | 1.393 | 1889 |
| S5 | 6.05 | 1876 |
| S6 | 8.93 | 1881 |
| P1 | 2.485 | 1816 |
| P2 | 2.122 | 1819 |
| P3 | 2.405 | 1820 |

As indicated in Table 2, the capacitance values of the series resonators S1~S3 are 3.618 pF, and the capacitance value of the series resonator S2 is 7.43 pF. The capacitance of the series resonator S3 is 1.558 pF, and the capacitance values of the series resonators S41 and S42 are 1.393 pF. The capacitance value of the series resonator S5 is 6.05 pF, and the capacitance value of the series resonator S6 is 8.93 pF. The capacitance value of the parallel resonator P1 is 2.485 pF. The capacitance value of the parallel resonator P2 is 2.122 pF. The capacitance value of the parallel resonator P3 is 2.405 pF. The resonance frequencies of the resonators are the same as those illustrated in Table 1. The ratio $C_p/C_s$ of the combined capacitance of the parallel resonators P1~P3 to that of the series resonators S1~S6 of the second comparative example is approximately 10% greater than that of the first comparative example.

A description is now given of results of calculation of the attenuation characteristics of the first and second comparative examples. FIG. 5A is a diagram of attenuation characteristics of the ladder filters in accordance with the first and second comparative examples, and FIG. 5B is an enlarged view of pass bands of the first and second comparative examples. In FIGS. 5A and 5B, the horizontal lines are the frequency, and the vertical lines are the amount of attenuation. Solid lines are the attenuation characteristics of the ladder filter in accordance with the first embodiment, and dotted lines are the attenuation characteristics of the ladder filter in accordance with the second embodiment. In FIG. 5A, frequency ranges A~E are defined by broken lines. The frequency range A is a band used for a portable telephone system. The frequency range B is a band used for GPS (Global Positioning System). The frequency range C is a band used for a wireless LAN (Local Area Network) and Bluetooth (BT). The frequency range D is a band of second harmonics of the transmission filter F11. The frequency range E is a band of third harmonics of the transmission filter F11. A range defined by broken lines in FIG. 5B is a transmission band of the W-CDMA band 2 system.

As illustrated in FIG. 5A, the first and second comparative examples have attenuation poles generated around the high-frequency ends of the pass bands. This is because the inductors L1, L2 and Lg having high inductance values are connected to the parallel arms. In the first comparative example, the degree of suppress deteriorates at frequencies lower than and higher than those of the pass band. Thus, the first comparative example has a difficulty in realizing a high degree of suppression over broad bands. The second comparative example has a higher degree of suppression than that of the first comparative example without increasing the number of attenuation poles. This is because the capacitance ratio $C_p/C_s$ is increased, as illustrated in Table 2.

However, as illustrated in FIG. 5B, the second comparative example has a deterioration of about 0.15~0.2 dB even in the pass band. Thus, the second comparative example has a difficulty in realizing both high suppression over broad bands and low insertion loss. Further, the first and second comparative examples, the suppression is easily degraded at high frequencies. This is because the inductors L1, L2 and Lg used to form the attenuation poles function as choke coils. The behaviors of the inductors L1, L2 and Lg as choke coils are conspicuous when these inductors have large inductance values. As has been described, in the duplexers or modules that conform to a system in which the reception band and the transmission band are close to each other like the W-CDMA band 2 system, an attenuation pole may be formed in the pass band of the other filter. When the inductors having large inductance values are used to form the attenuation pole, there is a high possibility that realization of high suppression over broad bands may have a difficulty.

A description is now given of a ladder filter in which an inductor is connected to a series arm. FIG. 6 is a circuit diagram of a duplexer using a ladder filter with an inductor being connected to a series arm. A description of parts similar to those in FIG. 4 is omitted here.

As illustrated in FIG. 6, a transmission filter F13 of a duplexer 100L is configured to replace the aforementioned series resonator S6 with a series resonator Sx connected in series and to have an inductor Ls connected in series to the series resonator Sx. One end of the series resonator Sx is connected in series to the series resonator S5, and the other end thereof is connected in series to one end of the inductor Ls. The other end of the inductor Ls is connected in series to the transmission terminal Tx. The series resonator Sx is an additional resonator connected in series between the series resonators S11~S5 and the transmission terminal Tx. The inductor Ls is connected in series to the series resonator Sx and the transmission terminal Tx. The transmission terminal Tx corresponds to an input terminal of the transmission filter F13, and the antenna terminal Ant corresponds to an output terminal of the transmission filter F13. Next, the reactance characteristic of the series resonator Sx is described.

Figure 7:
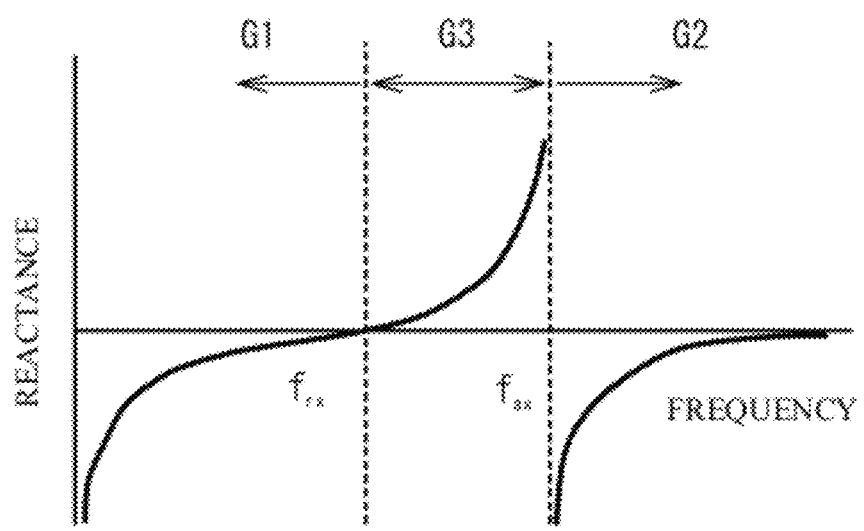
FIG. 7 is a diagram of a reactance characteristic of a series resonator Sx.

FIG. 7 is a diagram of a reactance characteristic of the series resonator Sx. The horizontal axis is the frequency, and the vertical axis is the reactance. Referring to FIG. 7, the reactance is zero at the resonance frequency $f_{rx}$. At the anti-resonance frequency $f_{ax}$, the reactance diverges. In a range G1 equal or lower than the resonance frequency $f_{rx}$ and a range G2 equal to or higher than the anti-resonance frequency $f_{ax}$, the series resonator Sx functions as a capacitor. In a range G3 between the resonance frequency $f_{rx}$ and the anti-resonance frequency $f_{ax}$, the series resonator Sx functions as an inductor. Now, a description is given of the capacitance and the resonance frequency of the resonators and the inductance value of the inductor included in the transmission filter F13.

Table 3 indicates the capacitance values and resonance frequencies of the resonators included in the transmission filter F13.

TABLE 3

| Resonator | Capacitance [pF] | Resonance frequency [MHz] |
| --- | --- | --- |
| S11 | 3.879 | 1881 |
| S12 | 3.879 | 1881 |
| S13 | 3.879 | 1881 |
| S2 | 7.8 | 1968 |
| S3 | 1.67 | 1901 |
| S41 | 1.491 | 1889 |
| S42 | 1.491 | 1889 |
| S5 | 4.964 | 1870 |
| Sx | 3.2 | 2400 |
| P1 | 2.485 | 1816 |
| P2 | 2.122 | 1819 |
| P3 | 2.405 | 1820 |

As indicated in FIG. 3, the capacitance values and resonance frequencies of the series resonators S11~S42 are the same as those of the comparative example 1 indicated in Table 1. The capacitance value of the series resonator S5 is 4.964 pF, and the resonance frequency thereof is 1870 MHz. The capacitance values and resonance frequencies of the parallel resonators P1~P3 are the same as those of the second comparative example indicated in Table 2. The capacitance value of the series resonator Sx is 3.2 pF, and the resonance frequency thereof is 2400 MHz. The inductance value of the inductor Ls is 2.2 nH, and the Q value thereof is 40.

In the transmission filter F13, the series resonator S2 has the highest anti-resonance frequency among the series resonators S11~S5 except the series resonator Sx. As indicated in Table 3, the resonance frequency $f_{rx}$ of the series resonator Sx is 2400 MHz, which is higher than the anti-resonance frequency of the series resonator S2. In other words, the resonance frequency $f_{rx}$ of the series resonator Sx is higher than the anti-resonance frequencies of the series resonators S11~S5. As indicated in FIG. 2B, the frequency of the high-frequency end of the pass band of the ladder filter is defined by the anti-resonance frequency of the series resonator. Thus, the resonance frequency $fr_x$ is located at the high-frequency side of the pass band of the transmission filter F13. In this case, the pass band of the transmission filter F13 corresponds to the range G1 illustrated in FIG. 7. Therefore, the series resonator Sx functions as a capacitance in the pass band of the transmission filter F13. As a result, the series resonator Sx and the inductor Ls function as an LC resonance circuit in the passband.

It is assumed that the capacitance of the series resonator Sx is Cx and the inductance of the inductor Ls is Lx. The resonance frequency $f_{lc}$ of an LC resonance circuit LC1 formed by the series resonator Sx and the inductor Ls is expressed as follows:

$$f_{lc} = \frac{1}{2\pi\sqrt{L_x C_x}}$$

The resonance frequency $f_{lc}$ of the LC resonance circuit LC1 is higher than the frequency $f_{down}$ of the low-frequency end of the pass band and is lower than the frequency $f_{up}$ of the high-frequency end thereof. That is, the following relationship stands:

$$f_{down} < 1/(2\pi(C_x \cdot L_x)^{1/2}) \leq f_{up}$$

Figure 8A:
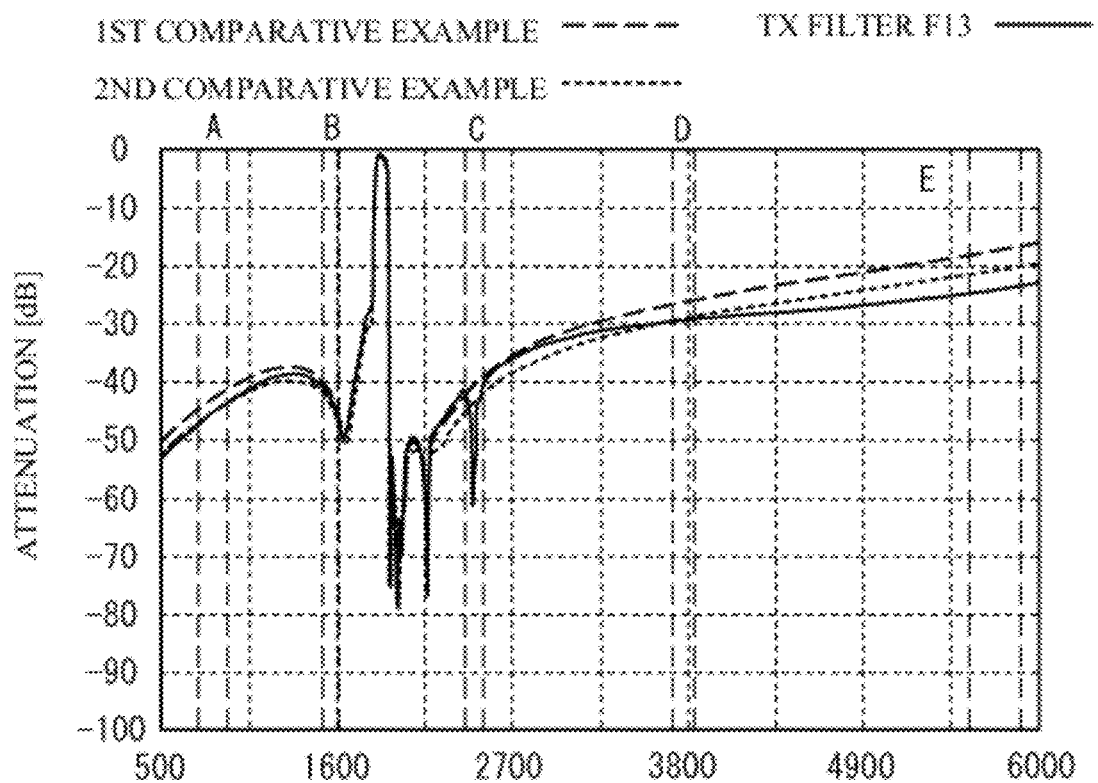
FIG. 8A is a diagram of an attenuation characteristic of a transmission filter F13.
Figure 8B:
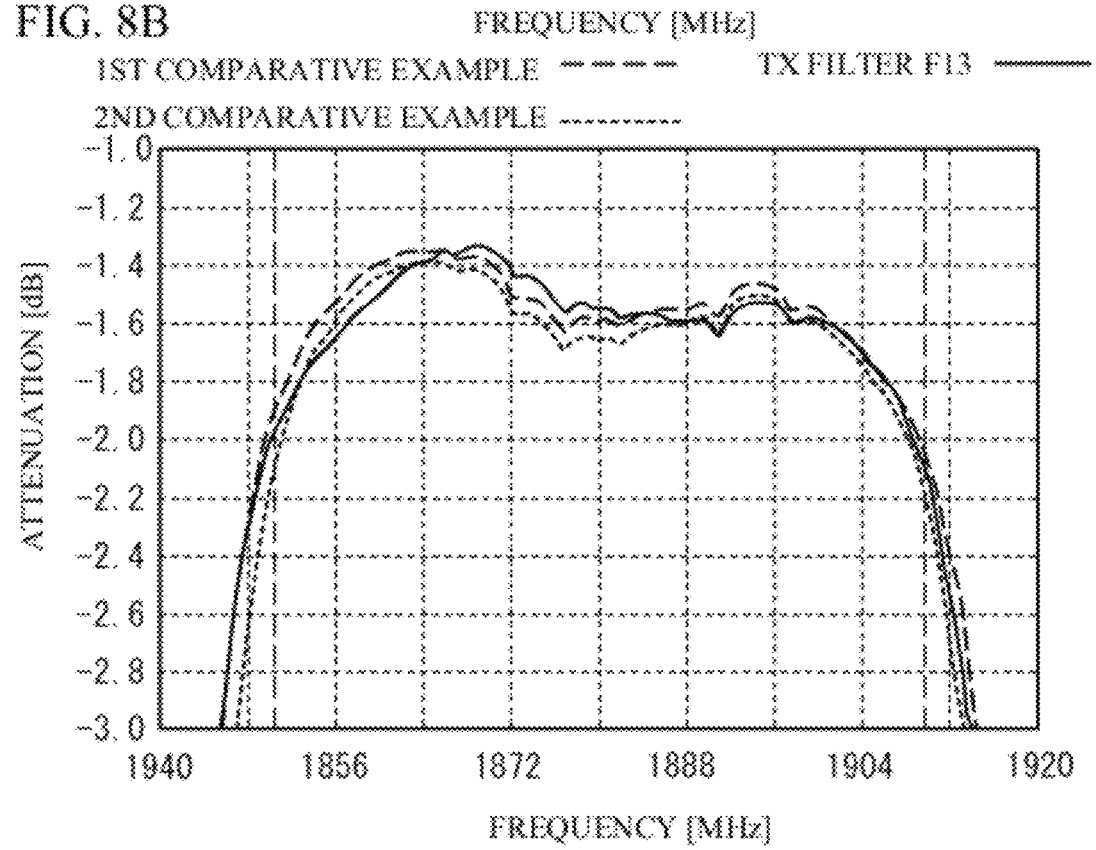
FIG. 8B is an enlarged view of a pass band illustrated in FIG. 8A.

Next, a description is given of results of calculation of the attenuation characteristic of the transmission filter F13. FIG. 8A is a diagram of an exemplary attenuation characteristic of the transmission filter F13, and FIG. 8B is an enlarged view of the pass band in FIG. 8A. Solid lines are the attenuation characteristic of the transmission filter F13, and broken lines are the attenuation characteristic of the ladder filter of the first comparative example. Dotted lines are the attenuation characteristics of the ladder filter of the second comparative example.

As illustrated in FIG. 8A, the transmission filter F13 has high suppression over a broad band including the frequency ranges A through E. As illustrated in FIG. 8B, the transmission filter F13 has good characteristics that are as good as or better than those of the transmission filter F11 of the first comparative example in the pass band, particularly, at the edges of the reception bands of the W-CDMA Band 2 system (around 1850 MHz and around 1910 MHz).

A description is given of a mechanism obtained from the attenuation characteristics illustrated in FIGS. 8A and 8B. As has been described, the resonance frequency $f_{rx}$ of the series resonator Sx is higher than the resonance frequencies of the series resonators S11~S5. In other words, the resonance frequency $f_{rx}$ is located at the high-frequency side of the pass band of the transmission filter F13. Thus, the series resonator Sx functions as a capacitor in the pass band of the transmission filter F13. The series resonator Sx and the inductor Ls function as the LC resonance circuit LC1 in the pass band. From the relationship $f_{down} < 1/(2\pi(C_x \cdot L_x)^{1/2}) < f_{up}$ described above, the insertion loss in the pass band can be canceled by the resonance of the LC resonance circuit. The resonance frequency $f_{lc}$ may be set around the center frequency of the pass band, for example.

In the frequency range lower than the pass band, the LC resonance circuit LC1 functions as a capacitor, and the capacitance ratio Cp/Cs of the transmission filter F13 has a larger value. Thus, in the low-frequency range, high suppression is available. In the frequency range higher than the pass band, the LC resonance circuit LC1 functions as an inductor, and plays a role of choke coil. Thus, high suppression is available even in the high-frequency range. Attenuation poles are generated around the high-frequency end of the pass band. As described above, the transmission filter F13 is capable of generating the attenuation poles and realizing high suppression over the broad band while suppressing increase in the insertion loss in the pass band.

As has been described, in order to have the series resonator Sx and the inductor Ls function as an LC resonance circuit in the pass band of the transmission filter F13, the series resonator Sx is required to function as a capacitor in the pass band. Therefore, the resonance frequency $f_{rx}$ of the series resonator Sx is higher than or lower than the pass band. However, as has been described with reference to FIG. 7, the series resonator Sx functions as an inductor in the frequency range G3 between the resonance frequency $f_{rx}$ and the anti-resonance frequency $f_{ax}$. Thus, even when the resonance frequency $f_{rx}$ of the series resonator Sx is lower than the pass band, in a case where the pass band and the frequency range G3 overlap with each other, it may be difficult for the series resonator Sx to function as a capacitor. It is therefore preferable that the anti-resonance frequency $f_{ax}$ of the series resonator Sx is lower than the resonance frequency of the parallel resonator of the transmission filter F13. In other words, the anti-resonance frequency $f_{ax}$ is preferably lower than the frequency at the low-frequency end of the pass band. In this case, the pass band corresponds to the frequency range G2 in FIG. 7, and the series resonator Sx functions as a capacitor.

Figure 9:
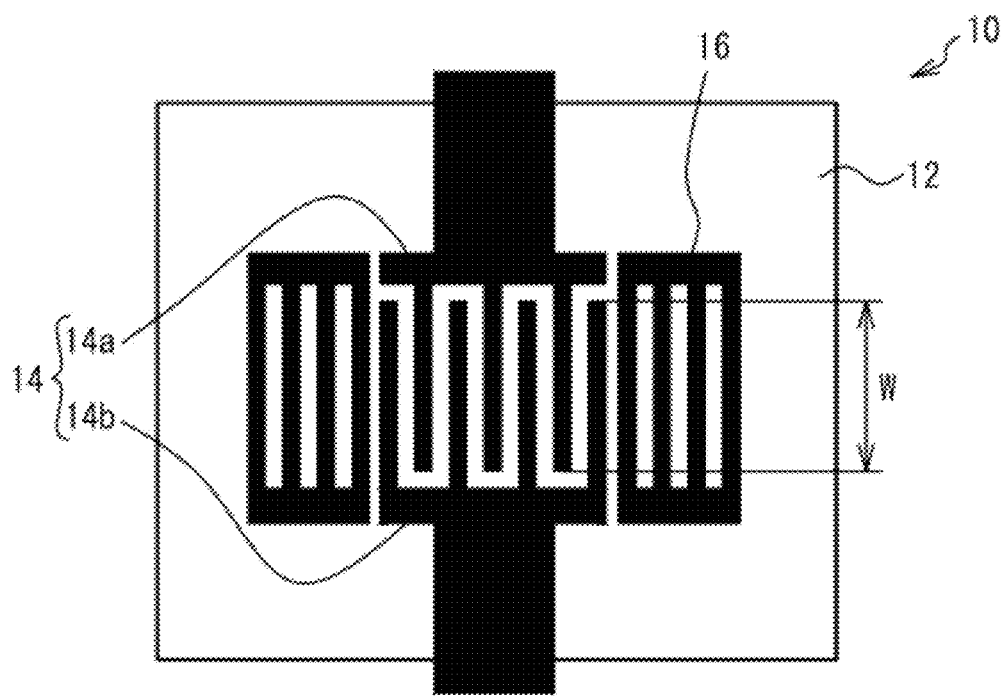
FIG. 9 is a plan view of a surface acoustic wave resonator.

A description is now given of an example in which surface acoustic wave (SAW) resonators are used. FIG. 9 is a plan view of an exemplary SAW resonator. The view of FIG. 9 is schematic, and the SAW resonator is not limited to the number of electrode fingers illustrated in FIG. 9.

Referring to FIG. 9, a SAW resonator 10 includes a piezoelectric substrate 12, an IDT (InterDigital Transducer) 14 and two reflectors 16. The IDT 14 and the reflectors 16 are provided on the piezoelectric substrate 12. The IDT 14 includes a pair of comb-like electrodes 14a and 14b that are interleaved with each other, and excites acoustic waves. The two reflectors 16 are arranged at both sides of the IDT 14 in directions in which the acoustic waves are propagated. The wavelength $\lambda$ of the acoustic waves depends on the pitch between the electrode fingers of the IDT 14, and may be 1.62 μm, for example. The aperture length W of the interleaved electrode fingers of the IDT 14 may be 19.9λ, for example. The number of pairs of electrode fingers of the IDT 14 may be 59.5, for example. The capacitance of the SAW resonator may be adjusted by varying the pitch between the electrode fingers or the aperture length W of the interleaved electrode fingers. The piezoelectric substrate 12 may be made of a piezoelectric substance such as lithium tantalate (LiTaO$_3$) or lithium niobate (LiNbO$_3$), for example. The IDT 14 and the reflectors 16 may be made of a metal such as aluminum (Al).

A description is now given of the pass characteristic and Q value of the SAW resonator 10. The Q value of the SAW resonator is defined as a Q value obtained when the SAW resonator 10 functions as a capacitor.

Figure 10A:
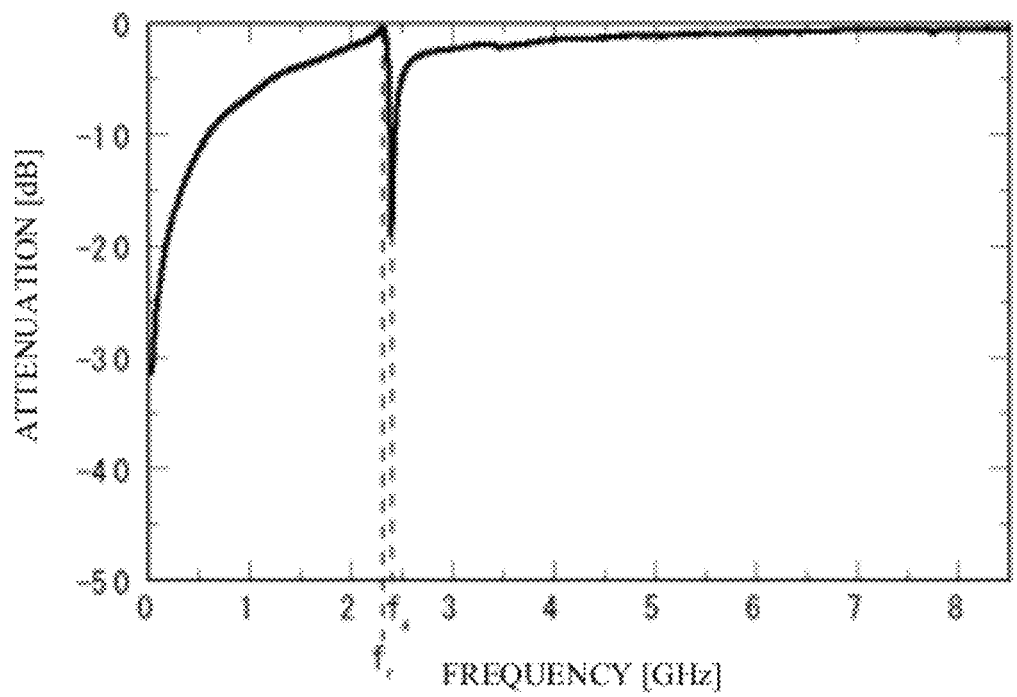
FIG. 10A is a diagram of a pass characteristic of a surface acoustic wave resonator.
Figure 10B:
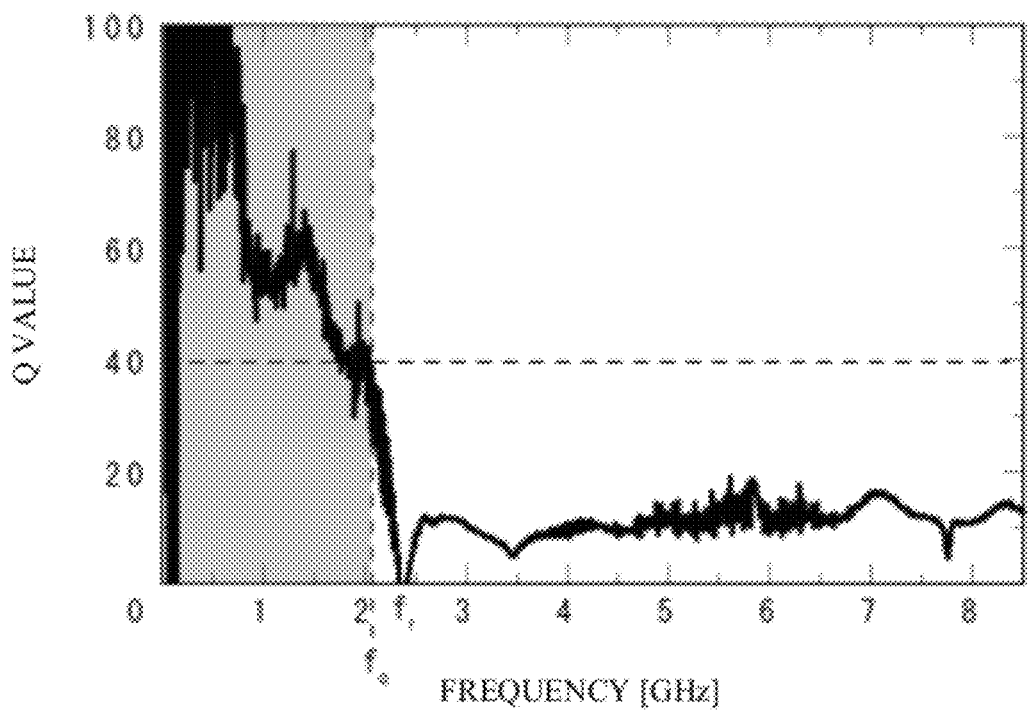
FIG. 10B is a diagram of a Q value of the surface acoustic wave resonator.

FIG. 10A is a diagram of an exemplary pass characteristic of the SAW resonator, and FIG. 10B is a diagram of an exemplary Q value thereof. In FIGS. 10A and 10B, the horizontal axis is the frequency, and the vertical axis of FIG. 10A is the amplitude, while the vertical axis of FIG. 10B is the Q value.

As illustrated in FIG. 10A, the resonance frequency $f_r$ of the SAW resonator 10 is 2332 MHz, and the amplitude is the largest at the resonance frequency $f_r$. The anti-resonance frequency $f_a$ is 2405 MHz, and the amplitude is the smallest at the anti-resonance frequency $f_a$. As illustrated in FIG. 10B, the Q value is zero around the resonance frequency $f_r$. At the high-frequency side of the resonance frequency $f_r$, the Q value is about 10. At the high-frequency side of the resonance frequency, there are bulk waves that are excited by the IDT 14 and are emitted in the piezoelectric substrate 12. The bulk waves result in loss and causes a decrease in the Q value.

In contrast, the Q value increases at the low-frequency side of the resonance frequency fr. As illustrated in a left-hand side in FIG. 10B, the Q value is equal to or larger than 40 at frequencies lower than $f_q$, where fq is 2050 MHz. Thus, the frequency ratio $f_r/f_q=1.138$ and $f_r=1.138 \times f_q$ A case is considered where the SAW resonator 10 is employed as the series resonator Sx. As has been described, in the transmission filter F13 illustrated in FIG. 6, the series resonator Sx functions as a capacitor in the pass band of the transmission filter F13. As the inductor Ls illustrated in FIG. 6, a chip inductor may be used. The Q value of the chip inductor included in the ladder filter is about 40, for example. In order to prevent the characteristics of the ladder filter from deteriorating, the Q value of the series resonator Sx is equal to or larger than 40.

As has been described with reference to FIG. 10B, the Q value is equal to or larger than 40 at the low-frequency side of the resonance frequency $f_q$. It is therefore preferable that the frequency $f_{up}$ of the high-frequency end of the pass band of the transmission filter F13 is lower than $f_q$, that is, lower than 2050 MHz. In other words, it is preferable that the resonance frequency $f_{rx}$ of the series resonator Sx meets the following condition with respect to the high-frequency end of the pass band of the transmission filter F13:

$$f_{rx} > 1.138 \times f_{up}$$

Thus, the range on the left-hand side of FIG. 10B corresponds to the pass band. The frequency $f_{up}$ may be equal to or lower than $f_q$.

As described above, the series resonator Sx functions as a capacitor in the pass band, and forms the LC resonance circuit LC1 together with the inductor Ls. It is thus possible to obtain high suppression over the broad bands. Since the resonance frequency $f_{lc}$ of the LC resonance circuit LC1 is located within the pass band, the loss in the pass band can be reduced. The resonance frequency $f_{rx}$ of the series resonator Sx may be either higher than the anti-resonance frequency of the series resonator or lower than the resonance frequency of the parallel resonator. However, in the case where the resonator with the IDTs is used for the filter, it is preferable that the resonance frequency $f_{rx}$ is higher than the anti-resonance frequency of the series resonator and satisfies the condition $f_{rx} > 1.138 \times f_{up}$.

First Embodiment

Embodiments according to the aspects described above are described below. A first embodiment uses the SAW resonators. FIG. 11A is a block diagram of an exemplary duplexer in accordance with the first embodiment, and FIG. 11B is a block diagram of an RF module equipped with the duplexer in accordance with the first embodiment.

Referring to FIG. 11A, a duplexer 100 has a reception filter 100a and a transmission filter 100b. The reception filter 100a and the transmission filter 100b are connected to a common terminal (antenna terminal) 102. The common terminal 102 is connected to an antenna 104. The reception filter 100a receives a signal from the antenna 104, and the filtered signal is applied to an amplifier, for example. The transmission filter 100b filters a signal from an amplifier, for example, and the filtered signal is applied to the antenna 104 via which the signal is transmitted.

Referring to FIG. 11B, an RF module 110 is equipped with an antenna 104, an antenna switch 112, a duplexer bank 114 and an amplifier module 116. The RF module 110 corresponds to a plurality of communication systems such as the GSM (Global System for Mobile Communication) system and the W-CDMA system, and is installed in the portable telephone or the like. The GSM system handles the 850 MHz band (GSM 850), 900 MHz band (GSM 900), 1800 MHz band (GSM 1800), and 1900 MHz band (GSM 1900). The antenna 104 is capable of handling the GSM system and the W-CDMA system. The duplexer bank 114 includes a plurality of duplexers 114a, 114b and 114c. Each of the duplexers corresponds to one of the communication systems. The duplexer bank 114 may have two duplexers or more than three duplexers. The antenna switch 112 selects the duplexer that conforms to the communication system used for signal transmission and reception from among the duplexers of the duplexer bank 114, and makes a connection between the selected duplexer and the antenna 104. The duplexers 114a, 114b and 114c of the duplexer bank 114 are connected to the amplifier module 116. The amplifier module 116 amplifies the signals received by the reception filters of the duplexers 114a~114c, and outputs the amplified signal to a next-stage processing part. Further, the amplifier module 116 amplifiers signals generated by a processing part (not illustrated), and outputs the amplified signals to the transmission filters of the duplexers 114a~114c.

Figure 12:
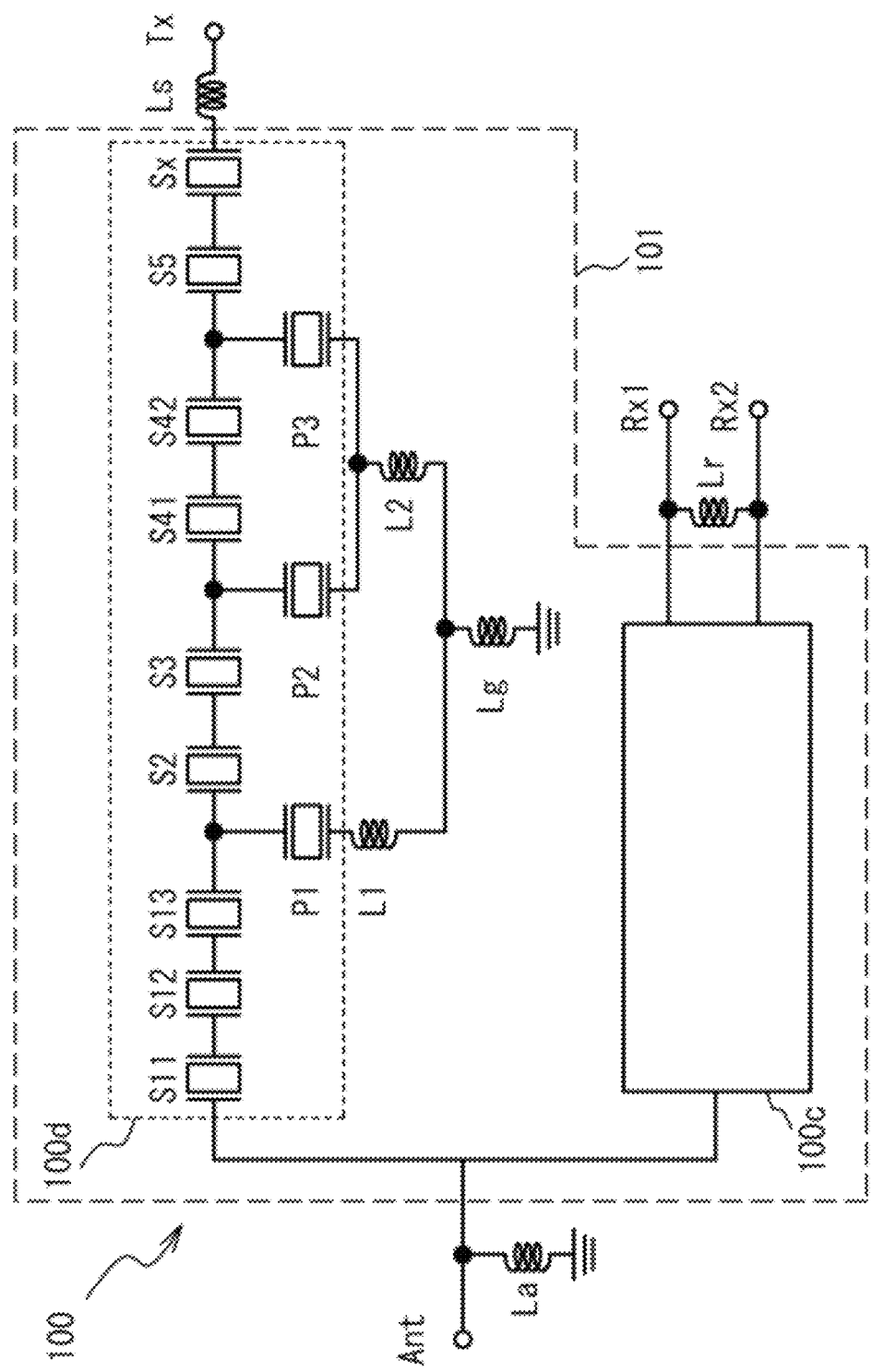
FIG. 12 is a circuit diagram of a duplexer in accordance with the first embodiment.

A description is given of the configuration of the duplexer in accordance with the first embodiment. FIG. 12 is a circuit diagram of the configuration of the duplexer in accordance with the first embodiment.

Referring to FIG. 12, the circuit configuration of the duplexer 100 in accordance with the first embodiment is the same as illustrated in FIG. 6. The duplexer 100 has a duplexer 101, which includes structural components other than the inductors La, Lr and Ls. The duplexer chip 101 includes a reception filter chip 100c and a transmission filter chip 100d. The detailed configuration of the duplexer chip 101 will be described later. Structural components of the transmission filter other than inductors L1, L2, Lg and Ls are realized as a transmission filter chip 100d. The inductors La, Lr and Ls are realized by chip inductors.

The resonance frequencies and capacitance values of the resonators are the same as those described in Table 3. The resonance frequency $f_{rx}$ of the series resonator Sx is higher than the anti-resonance frequencies of the series resonators S11~S5. The resonance frequency $f_{rx}$ satisfies the aforementioned condition $f_{rx} > 1.138 \times f_{up}$. The inductance value of the inductor Ls may be 2.2 nH, and the Q value thereof may be 40, for example.

Figure 13A:
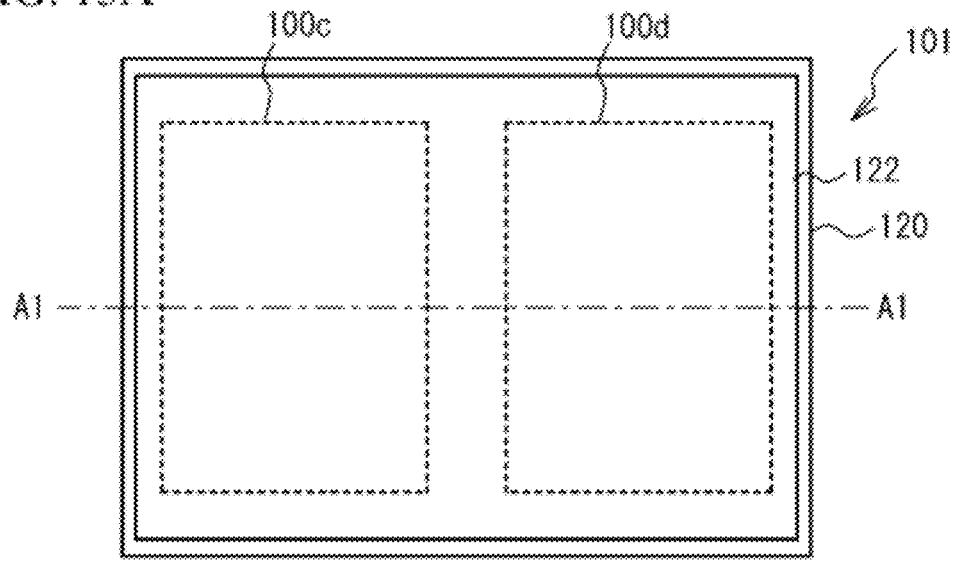
FIG. 13A is a plan view of a duplexer chip in accordance with the first embodiment.
Figure 13B:
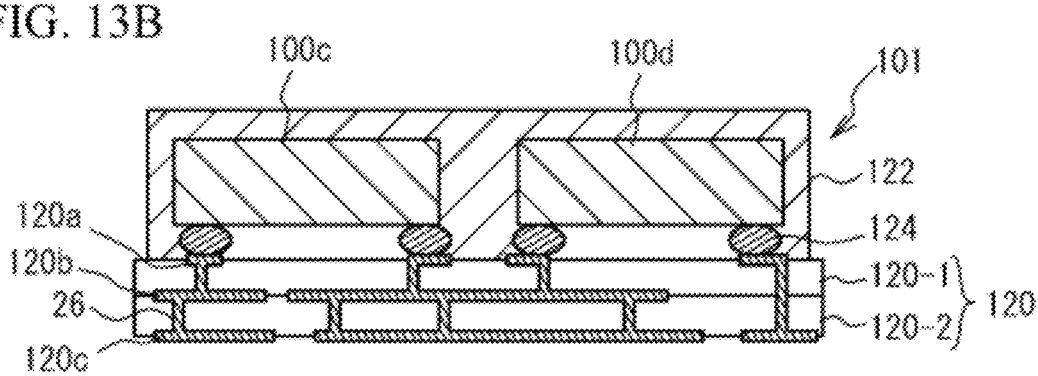
FIG. 13B is a cross-sectional view taken along a line A1-A1 in FIG. 13A.
Figure 13C:
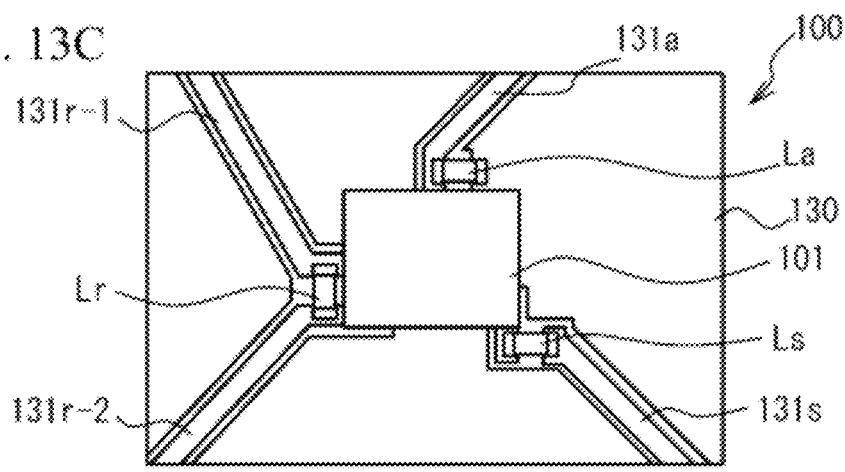
FIG. 13C is a plan view of the duplexer.

FIG. 13A is a plan view of the duplexer chip 101, and FIG. 13B is a cross-sectional view taken along a line A1-A1 illustrated in FIG. 13A. FIG. 13C is a plan view of the duplexer chip 101.

As illustrated in FIGS. 13A and 13B, the duplexer chip 101 includes the reception filter chip 100c, the transmission filter chip 100d, a package substrate 120 and a seal member 122. The view of FIG. 13A is seen through the seal member 122. As illustrated in FIG. 13B, the reception filter chip 100c and the transmission filter chip 100d are flip-chip mounted on the package substrate 120 by bumps 124. The package substrate 120 has a two-layer structure composed of a first layer 120-1 and a second layer 120-2 located below the first layer 120-1. Interconnection layers 120a, 120b and 120c are formed on the upper, intermediate and lower surfaces of the package substrate 120, which are connected together by via interconnections 26. The interconnection layer 120b is located between the first layer 120-1 and the second layer 120-2. The interconnection layer 120c functions as footpads. Some interconnections provided on or in the package substrate 120 function as inductors. The seal member 122 may be made of an insulative material such as epoxy resin or solder, and seals the reception filter chip 100c and the transmission filter chip 100d. The package substrate 120 may be made of an insulative material such as ceramic. The interconnection layers 120a~120c are made of a metal such as aluminum. The bumps 124 may be made of a metal such as gold.

As illustrated in FIG. 13C, the duplexer chip 101 is flip-chip mounted on a printed-circuit board 130 via the interconnection layer 120c. The inductors Lr, La and Ls, which are chip inductors, are mounted on the printed-circuit board 130. Although not illustrated, the antenna terminal Ant, the reception terminals Rx1 and Rx2 and the transmission terminal Tx are provided on the printed-circuit board 130. The duplexer chip 101 and the inductor Lr are connected together by interconnection lines 131r-1 and 131r-2. The interconnection line 131r-1 is connected to the reception terminal Rx1. The interconnection line 131r-2 is connected to the reception terminal Rx2. The duplexer chip 101 and the inductor La are connected together via an interconnection line 131a. The interconnection line 131a is connected to the antenna terminal Ant. The duplexer chip 101 and the inductor Ls are connected together by an interconnection line 131s. The interconnection line 131s is connected to the transmission terminal Tx.

In FIG. 13C, the printed-circuit board 130 may be replaced with a module board. The RF module 110 illustrated in FIG. 11B is formed by mounting the duplexer chips and the chip inductors on the printed-circuit board 130 or the module board.

Figure 14:
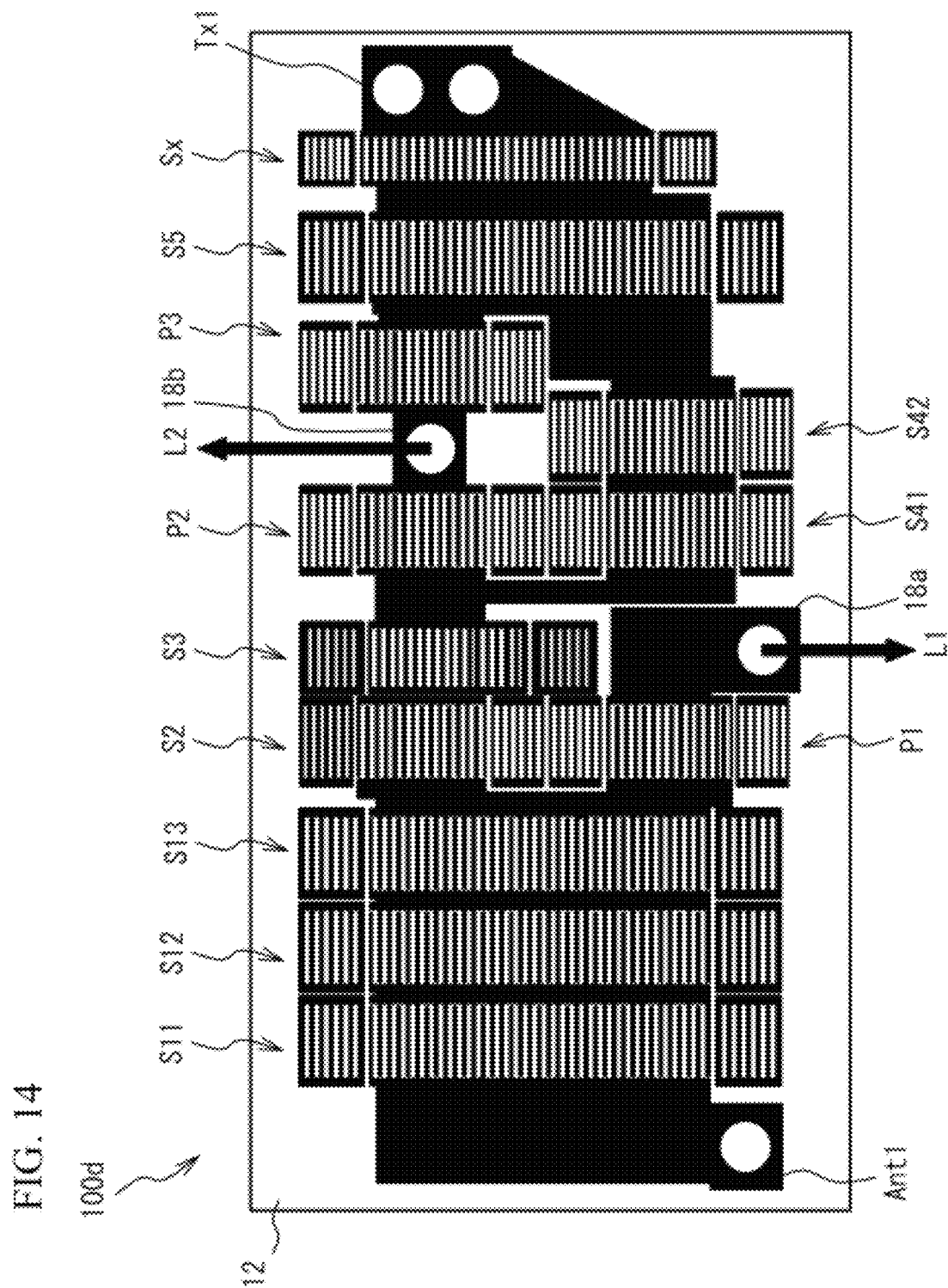
FIG. 14 is a transparent view of a transmission filter chip installed in the duplexer of the first embodiment.

The filters of the duplexer are now described. FIG. 14 is a perspective view of the transmission filter chip 100d of the duplexer configured in accordance with the first embodiment.

Referring to FIG. 14, the transmission filter chip 100d is composed of the piezoelectric substrate 12, the series resonators S11~Sx, the parallel resonators P1~P3, the antenna terminal Ant1, the transmission terminal Tx1 and terminals 18a and 18b. The series resonators S11~Sx and the parallel resonators P1~P3 are SAW resonators in which the IDT and the reflectors of each SAW filter are arranged on the piezoelectric substrate 12. The transmission filter chip 100d is flip-chip mounted so that the surface of the piezoelectric substrate 12 on which the SAW resonators are formed and the upper surface of the package substrate 120 face each other. As illustrated in FIG. 13B, since a spacing is formed between the transmission filter chip 100d and the package substrate 120, the acoustic waves are excited without any obstacles.

One of the comb-like electrodes of the series resonator S11 is connected to the antenna terminal Ant1. The antenna terminal Ant1 is connected to the antenna 104 illustrated in FIG. 11A or 11B. One of the comb-like electrodes of the parallel resonator P1 is connected to the terminal 18a. The terminal 18a is connected to the inductor L1 illustrated in FIG. 12. One of the comb-like electrodes of the parallel resonator P2 and one of the comb-like electrodes of the parallel resonator P3 are connected to the terminal 18b. The terminal 18b is connected to the inductor L2 illustrated in FIG. 12. One of the comb-like electrodes of the series resonator Sx is connected to the transmission terminal Tx1. The transmission terminal Tx1 is connected to the transmission terminal Tx via the inductor Ls illustrated in FIGS. 12 and 13C. Each terminal is used for flip-chip mounting on the package substrate 120 illustrated in FIG. 13B. Circular shapes on the solid patterns are areas in which the bumps 124 are connected.

Figure 15A:
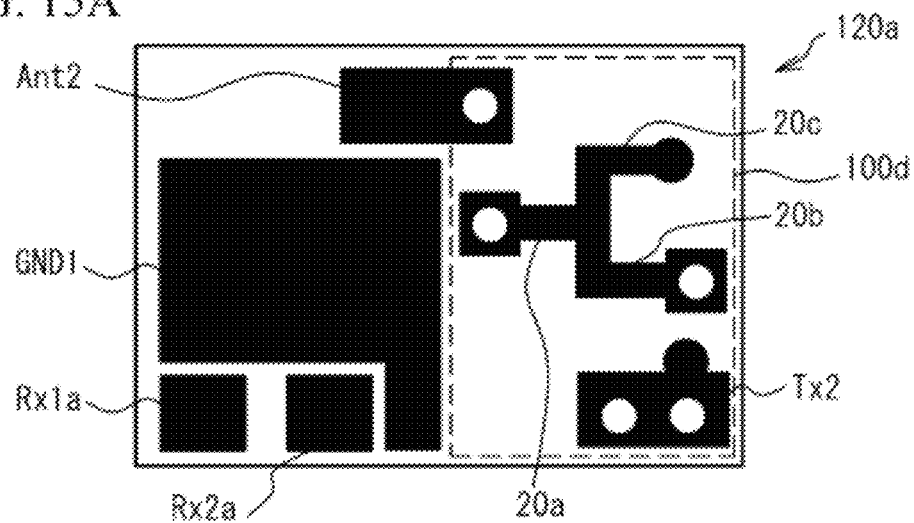
FIGS. 15A, 15B and 15C are respectively plan views of a package substrate.
Figure 15B:
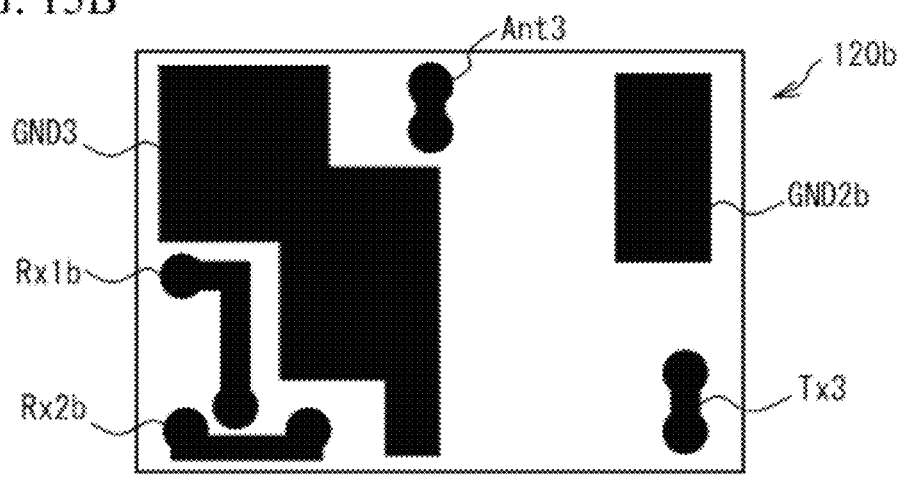
Figure 15C:
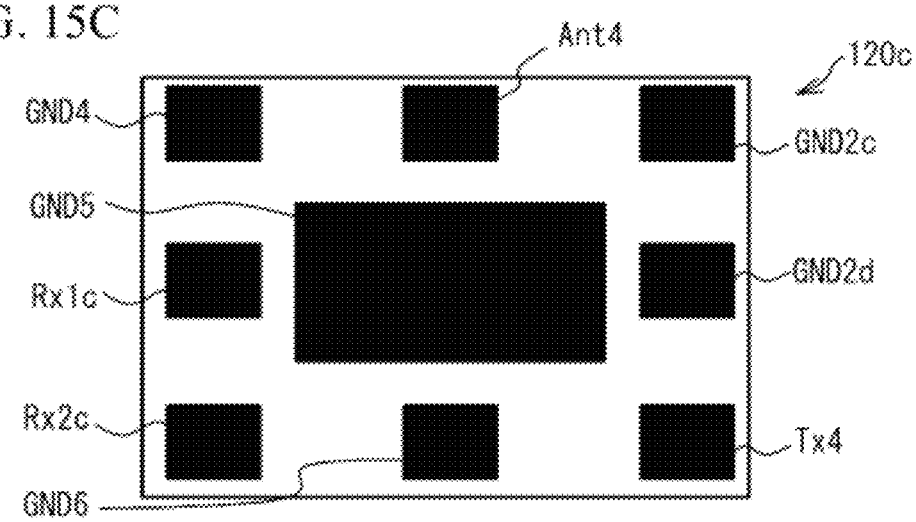

The package substrate 120 is now described. FIGS. 15A through 15C are respectively plan views of the package substrate 120. FIG. 15A illustrates the upper surface of the package substrate 120. FIG. 15B illustrates the plan view of the second layer 120-2 of the package substrate 120 seen through the first layer 120-1. FIG. 15C is a view seen through the first layer 120-1 and the second layer 120-2.

As illustrated in FIG. 15A, the interconnection layer 120a is provided on the first layer 120-1. The interconnection layer 120a includes an antenna terminal Ant2, a transmission terminal Tx2, interconnection lines 20a, 20b and 20c, reception terminals Rx1a and Rx2a, and a ground terminal GND1. The transmission filter chip 100d is mounted in an area surrounded by a broken line in FIG. 15A. The antenna terminal Ant2 of the interconnection layer 120a is connected to the antenna terminal Ant1 of the transmission filter chip 100d. The transmission terminal Tx2 of the interconnection layer 120a is connected to the transmission terminal Tx1 of the transmission filter chip 100d. The interconnection line 20a of the interconnection layer 120a is connected to the terminal 18a of the transmission filter chip 100d. The interconnection line 20b of the interconnection layer 120a is connected to the terminal 18b of the transmission filter chip 100d. The interconnection lines 20a and 20b are connected to the interconnection line 20c. The interconnection line 20a contributes to the generation of the inductor L1 illustrated in FIG. 12. The interconnection line 20b contributes to the generation of the inductor L2. The interconnection line 20c contributes to the generation of the inductor Lg. As described above, the inductors L1, L2 and Lg are provided on the package substrate 120. The reception terminals Rx1a and Rx2a are connected to reception terminals included in the footpads of the reception filter chip 100c. The ground terminal GND1 is connected to a ground terminal included in the footpads of the reception filter chip 100c.

Referring to FIG. 15B, the interconnection layer 120b is provided on the upper surface of the second layer 120-2. The interconnection layer 120b includes an antenna pattern Ant3, a transmission pattern Tx3, reception patterns Rx1b and Rx2b, and ground patterns GND2b and GND3. As has been described with reference to FIG. 12B, the interconnection layers 120a and 120b are connected together by the via interconnections 26. Specifically, the antenna pattern Ant3 of the interconnection layer 120b is connected to the antenna terminal Ant2 of the interconnection layer 120a. The transmission pattern Tx3 of the interconnection layer 120b is connected to the transmission terminal Tx2 of the interconnection layer 120a. The ground pattern GND2b of the interconnection layer 120b is connected to the interconnection line 20c of the interconnection layer 120a. The reception pattern Rx1b of the interconnection layer 120b is connected to the reception terminal Rx1a of the interconnection layer 120a. The reception pattern Rx2b of the interconnection layer 120b is connected to the reception terminal Rx2a of the interconnection layer 120a. The ground pattern GND3 of the interconnection layer 120b is connected to the ground terminal GND1 of the interconnection layer 120a.

Referring to FIG. 15C, the interconnection layer 120c is provided on the lower surface of the second layer 120-2. The interconnection layer 120c includes an antenna terminal Ant4, a transmission terminal Tx4, reception terminals Rx1c and Rx2c, and ground terminals GND2c, GND2d, GND4, GND5 and GND6. As has been described with reference to FIG. 12B, the interconnection layers 120b and 120c are connected together by the via interconnections 26. Specifically, the antenna terminal Ant4 of the interconnection layer 120c is connected to the antenna pattern Ant3 of the interconnection layer 120b. The transmission terminal Tx4 of the interconnection layer 120c is connected to the transmission pattern Tx3 of the interconnection layer 120b. The ground terminals GND2c and GND2d of the interconnection layer 120c are connected to the ground pattern GND2b of the interconnection layer 120b. The reception terminal Rx1c of the interconnection layer 120c is connected to the reception pattern Rx1b of the interconnection layer 120b. The reception terminal Rx2c of the interconnection layer 120c is connected to the reception pattern Rx2b of the interconnection layer 120c. The ground terminals GND4, GND5 and GND6 of the interconnection layer 120c is connected to the ground pattern GND3 of the interconnection layer 120b.

The transmission filter 100b of the duplexer 100 in accordance with the first embodiment includes the series resonators S11~S5, the parallel resonators P1~P3, the series resonator Sx (additional resonator), and the inductor Ls connected in series to the series resonator Sx. The resonance frequency $f_{rx}$ of the series resonator Sx is higher than the anti-resonance frequencies of the series resonators S11~S5. Thus, the series resonator Sx functions as a capacitor, and forms the LC resonance circuit LC1 together with the inductor Ls. As a result, as illustrated in FIGS. 8A and 8B, the transmission filter 100b realizes high suppression over the broad bands. The resonance frequency of the LC resonance circuit LC1 is located in the pass band of the transmission filter 100b. Thus, the insertion loss in the pass band can be reduced.

The anti-resonance frequency fax of the series resonator Sx may be lower than the resonance frequencies of the parallel resonators P1~P3. However, in the case where the resonator is the SAW resonator as illustrated in FIG. 14, the resonance frequency $f_{rx}$ satisfies the aforementioned condition $f_{rx} > 1.138 \times f_{up}$, the series resonator Sx functions as a capacitor having a Q value of 40 or more. Thus, deterioration of the frequency characteristic is suppressed. As described above, in the case where the SAW resonator is used, it is preferable that the resonance frequency $f_{rx}$ is higher than the anti-resonance frequencies of the series resonators S11~S5. Further, it is preferable that the aforementioned condition $f_{rx} > 1.138 \times f_{up}$ is satisfied. In a case where the resonator is not the SAW resonator but another type of resonator using IDT such as a Love wave resonator, a Lamb wave resonator, a boundary acoustic wave resonator, a high Q value is obtained by meeting the aforementioned condition $f_{rx} > 1.138 \times f_{up}$. The resonator may be a resonator that does not use IDT, such as a piezoelectric thin-film resonator.

In the first embodiment, the series resonator Sx that functions as a capacitor is incorporated in the ladder filter. Thus, it is possible to realize compact ladder filters, duplexers and RF modules, as compared with those to which a capacitance element is externally connected. The inductors L1, L2 and Lg are formed by the interconnection layers 120a~120c in the package substrate 120. Thus, the duplexer 100 and the RF module 110 may be downsized. The inductors La, Ls and Lr may be formed by the interconnection layers 120a~120c. Thus, the duplexer 100 and the RF module 110 may further be downsized.

By using the inductors La and Lr, the attenuation poles are formed around the high-frequency end of the pass band of the transmission filter 100b, as illustrated in FIG. 8A. Thus, the transmission filter 100b has high suppression in the pass band of the reception filter 100a, whereby interference between the transmission filter 100b and the reception filter 100a can be suppressed. Generally, among a first filter of the duplexer and a second filter having a pass band at the high-frequency side of the first filter, namely, having frequencies higher than the frequency at the high-frequency end of the first filter, the first filter is preferably the SAW filter. The first filter may be the transmission filter or the reception filter, which may be selected in accordance with the communication system, for example. The ladder filter of the first embodiment may be applied to both the filters of the duplexer or may be applied to the second filter. In other words, the duplexer has at least ladder filter of the first embodiment.

The RF module includes at least one ladder filter of the first embodiment. The module of the first embodiment is not limited to the RF module but may be another type of module. The module that includes multiple filters on the single module board and utilizes multiple bands is capable of ensuring suppression over the board bands and having improved characteristics.

As illustrated in FIGS. 11A and 11B, the first embodiment is not limited to the aforementioned duplexer and the module with the duplexer but may be a ladder filter alone. The ladder filter is not limited to the multiple-stage configuration but may have only a single stage. The ladder filter includes one or multiple series resonators and one or multiple parallel resonators. The resonance frequency $f_{rx}$ of the series resonator Sx is higher than the anti-resonance frequencies of one or the multiple series resonators. The anti-resonance frequency $f_{ax}$ of the series resonator Sx is lower than the resonance frequencies of one or the multiple parallel resonators. When these conditions are satisfied, the series resonator Sx functions as a capacitor in the pass band of the ladder filter. The series resonator Sx (additional resonator) and the inductor Ls may be provided between the series resonator and the antenna terminal Ant (output terminal).

The present invention is not limited to the specifically disclosed embodiments but may include other embodiments and variations without departing from the scope of the present invention.

What is claimed is:

1. A ladder filter comprising:
at least one series resonator connected in series between an input terminal and an output terminal;
at least one parallel resonator connected in parallel with the at least one series resonator;
an additional resonator connected in series between the at least one series resonator and one of the input terminal and the output terminal; and
an inductor connected in series to the additional resonator,
the additional resonator having a resonance frequency higher than an anti-resonance frequency of the at least one series resonator,
wherein a resonance frequency of a resonance circuit formed by the additional resonator and the inductor is located within a pass band of the ladder filter, and
wherein the pass band ranges from a resonance frequency of the at least one parallel resonator to the anti-resonance frequency of the at least one series resonator.

2. The ladder filter according to claim 1, wherein the resonance frequency of the additional resonator is outside of the pass band of the ladder filter.

3. The ladder filter according to claim 1, wherein:
the at least one series resonator, the at least one parallel resonator, and the additional resonator are surface acoustic wave resonators, Love wave resonators, Lamb wave resonators, or boundary acoustic wave resonators; and
a resonance frequency frx of the additional resonator satisfies the following condition:

$$frx > 1.138 \times fup$$

where fup is a frequency at a high-frequency end of a pass band of the ladder filter.

4. A ladder filter comprising:
at least one series resonator connected in series between an input terminal and an output terminal;
at least one parallel resonator connected in parallel with the at least one series resonator;
an additional resonator connected in series between the at least one series resonator and one of the input terminal and the output terminal; and
an inductor connected in series to the additional resonator,
wherein the additional resonator has an anti-resonance frequency lower than a resonance frequency of the at least one parallel resonator, and
wherein a resonance frequency of a resonance circuit formed by the additional resonator and the inductor is located within a pass band of the ladder filter.

5. The ladder filter according to claim 4, wherein:
the at least one series resonator, the at least one parallel resonator, and the additional resonator are surface acoustic wave resonators, Love wave resonators, Lamb wave resonators, or boundary acoustic wave resonators; and
a resonance frequency frx of the additional resonator satisfies the following condition:

$frx > 1.138 \times fup$ where fup is a frequency at a high-frequency end of a pass band of the ladder filter.

6. A module comprising at least one ladder filter including:
   at least one series resonator connected in series between an input terminal and an output terminal;
   at least one parallel resonator connected in parallel with the at least one series resonator;
   an additional resonator connected in series between the at least one series resonator and one of the input terminal and the output terminal; and
   an inductor connected in series to the additional resonator,
   wherein the additional resonator having an anti-resonance frequency lower than a resonance frequency of the at least one parallel resonator, and
   wherein a resonance frequency of a resonance circuit formed by the additional resonator and the inductor is located within a pass band of the ladder filter.

7. A duplexer comprising at least one ladder filter including:
   at least one series resonator connected in series between an input terminal and an output terminal;
   at least one parallel resonator connected in parallel with the at least one series resonator;
   an additional resonator connected in series between the at least one series resonator and one of the input terminal and the output terminal; and
   an inductor connected in series to the additional resonator,
   wherein the additional resonator has a resonance frequency higher than an anti-resonance frequency of the at least one series resonator,
   wherein a resonance frequency of a resonance circuit formed by the additional resonator and the inductor is located within a pass band of the ladder filter, and
   wherein the pass band ranges from a resonance frequency of the at least one parallel resonator to the anti-resonance frequency of the at least one series resonator.

8. The duplexer according to claim 7, further comprising a first filter, and a second filter having a pass band at a high-frequency side of the first filter, wherein the first filter is the at least one ladder filter.

9. A module comprising at least one ladder filter including:
   at least one series resonator connected in series between an input terminal and an output terminal;
   at least one parallel resonator connected in parallel with the at least one series resonator;
   an additional resonator connected in series between the at least one series resonator and one of the input terminal and the output terminal; and
   an inductor connected in series to the additional resonator,
   wherein the additional resonator has a resonance frequency higher than an anti-resonance frequency of the at least one series resonator,
   wherein a resonance frequency of a resonance circuit formed by the additional resonator and the inductor is located within a pass band of the ladder filter, and
   wherein the pass band ranges from a resonance frequency of the at least one parallel resonator to the anti-resonance frequency of the at least one series resonator.

10. The module according to claim 9, further comprising a first filter, and a second filter having a pass band at a high-frequency side of the first filter, wherein the first filter is the at least one ladder filter.

11. A duplexer comprising at least one ladder filter including:
    at least one series resonator connected in series between an input terminal and an output terminal;
    at least one parallel resonator connected in parallel with the at least one series resonator;
    an additional resonator connected in series between the at least one series resonator and one of the input terminal and the output terminal; and
    an inductor connected in series to the additional resonator,
    wherein the additional resonator having an anti-resonance frequency lower than a resonance frequency of the at least one parallel resonator, and
    wherein a resonance frequency of a resonance circuit formed by the additional resonator and the inductor is located within a pass band of the ladder filter.

* * * * *